(12) United States Patent
Schadt, III et al.

(10) Patent No.: US 6,884,562 B1
(45) Date of Patent: Apr. 26, 2005

(54) PHOTORESISTS AND PROCESSES FOR MICROLITHOGRAPHY

(75) Inventors: Frank Leonard Schadt, III, Wilmington, DE (US); Michael Fryd, Moorestown, NJ (US); Mookkan Periyasamy, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/807,298

(22) PCT Filed: Oct. 26, 1999

(86) PCT No.: PCT/US99/25106

§ 371 (c)(1),
(2), (4) Date: Apr. 9, 2001

(87) PCT Pub. No.: WO00/25178

PCT Pub. Date: May 4, 2000

Related U.S. Application Data
(60) Provisional application No. 60/105,789, filed on Oct. 27, 1998.

(51) Int. Cl.$^7$ ............................................. G03C 1/492
(52) U.S. Cl. ................................ 430/270.1; 430/286.1; 430/287.1; 430/907; 430/910
(58) Field of Search .......................... 430/270.1, 286.1, 430/287.1, 907, 910

(56) References Cited

U.S. PATENT DOCUMENTS

| | | | |
|---|---|---|---|
| 4,613,657 A | * | 9/1986 | Narita et al. ................. 526/204 |
| 4,665,144 A | * | 5/1987 | Ohmori et al. .......... 351/160 R |
| 5,061,602 A | | 10/1991 | Koch et al. |
| 5,071,731 A | | 12/1991 | Chen et al. |
| 5,077,174 A | | 12/1991 | Bauer et al. |
| 5,120,629 A | | 6/1992 | Bauer et al. |
| 5,120,633 A | | 6/1992 | Bauer et al. |

(Continued)

FOREIGN PATENT DOCUMENTS

| | | |
|---|---|---|
| EP | 0473547 | 8/1991 |
| EP | 0773478 | 5/1997 |
| EP | 0789278 | 8/1997 |
| JP | 1996101506 A | 9/1994 |
| JP | 1998031310 A | 7/1996 |
| JP | 1998111569 A | 12/1996 |
| WO | WO 91/15810 A1 | 10/1991 |
| WO | WO 9215628 | 9/1992 |

OTHER PUBLICATIONS

Hertler et al., Synthesis and Applications of Acid–Labile Acrylic Polymers, International Symposium on New Polymers, 1991, 137–149.

Gabor et al., Poly(tert–butyl methacrylate)–Based Block and Random Copolymer Resists Designed for 193 nm Wavelength Exposure Tools, Chem. Mater. 1996, vol. 8, pp. 2282–2290.

Gabor et al., Silicon–Containing Block Copolymer Resist Materials, Microelectronics Technology, Chapter 19, pp. 281–298.

Ober et al., Block Copolymers as Lithographic Materials, Journal of Photopolymer Science and Technology, vol. 9, No. 1, 1996, pp. 1–12.

Patent Abstracts of Japan, Publication No. 09–189998, Date of Publication: Jul. 22, 1997, Applicant: Matsushita Electric Ind Co. LTD.

(Continued)

*Primary Examiner*—Yvette C. Thornton

(57) ABSTRACT

Positive photoresists and associated processes for microlithography in the ultraviolet (UV) and violet are disclosed. The photoresists comprise (a) a branched copolymer containing protected acid groups and (b) at least one photoacid generator. The photoresists have high transparency throughout the UV, good development properties, high plasma etch resistance and other desirable properties, and are useful for microlithography in the near, far, and extreme UV, particularly at wavelengths less than or equal to 365 nm.

28 Claims, 1 Drawing Sheet

U.S. PATENT DOCUMENTS

| | | | |
|---|---|---|---|
| 5,145,764 A | | 9/1992 | Bauer et al. |
| 5,252,427 A | | 10/1993 | Bauer et al. |
| 5,262,281 A | | 11/1993 | Bauer et al. |
| 5,492,793 A | * | 2/1996 | Breyta et al. ............. 430/270.1 |
| 5,585,222 A | * | 12/1996 | Kaimoto et al. ......... 430/270.1 |
| 5,861,231 A | * | 1/1999 | Barclay et al. .......... 430/270.1 |
| 5,891,603 A | * | 4/1999 | Kodama et al. ......... 430/270.1 |
| 5,928,840 A | | 7/1999 | Matsuo et al. |
| 5,942,367 A | * | 8/1999 | Watanabe et al. ............ 430/170 |
| 6,033,828 A | * | 3/2000 | Shimada et al. ....... 430/270.11 |
| 6,117,962 A | * | 9/2000 | Weng et al. ................ 526/127 |
| 6,136,498 A | | 10/2000 | Jagannathan et al. |
| 6,156,481 A | * | 12/2000 | Takeda et al. ........... 430/270.1 |
| 6,165,678 A | * | 12/2000 | Allen et al. .............. 430/270.1 |
| 6,210,856 B1 | * | 4/2001 | Lin et al. ................. 430/270.1 |
| 2001/0010890 A1 | * | 8/2001 | Hatakeyama et al. ..... 430/270.1 |
| 2001/0018162 A1 | * | 8/2001 | Hatakeyama et al. .... 430/270.1 |
| 2001/0051670 A1 | * | 12/2001 | Goupil et al. ............... 523/113 |

OTHER PUBLICATIONS

Patent Abstracts of Japan, Publication No. 09–101506, Date of Publication: Apr. 16, 1996, Applicant: Japan Synthetic Rubber Co. LTD.

Patent Abstracts of Japan, Publication No. 10–069071, Date of Publication: Mar. 10, 1998, Applicant: Internatl Business Mach Corp <IBM>.

Patent Abstracts of Japan, Publication No. 10–031310, Date of Publication: Feb. 03, 1998, Applicant: Japan Synthetic Rubber Co. LTD.

Patent Abstracts of Japan, Publication No. 10–111569, Date of Publication: Apr. 28, 1998, Applicant: Japan Synthetic Rubber Co. LTD.

Patent Abstracts of Japan, Publication No. 04–230645, Date of Publication: Aug. 19, 1992, Applicant: Ciba Geigy Ag.

Yamana M, Itani T, Yoshino H, Hashimoto S, Tanabe H, and Kasama K, "Deblocking Reaction of Chemically Amplified ArF Positive Resists" Proc. Spie—Int. Soc. Opt. Eng., vol. 3333, No. 1, Jun. 1988 pp. 32–42 (XP002130419).

Database WPI, Section Ch, Week 199815, Derwent Publications LTD, London, GB: (XP002130420).

Introduction to Microlithography, Second Edition, American Chemical Society, Chapter 3, pp. 139–267, "Organic Resist Materials" (1994).

Journal of Photopolymer Science and Technology, vol. 10, No. 3 (1997) 511–520.

Macromolecules, 30, pp. 6517–6524, (1997) "Synthesis of Cycloolefin–Maleic Anhydride Alternating Copolymers for 193 nm Imaging".

SPIE, vol. 2724, pp. 355–364, T. Wallow, F. Houlihan, O Nalamasu, E. Chandross, T. Neenan, and E. Reichmanis.

* cited by examiner

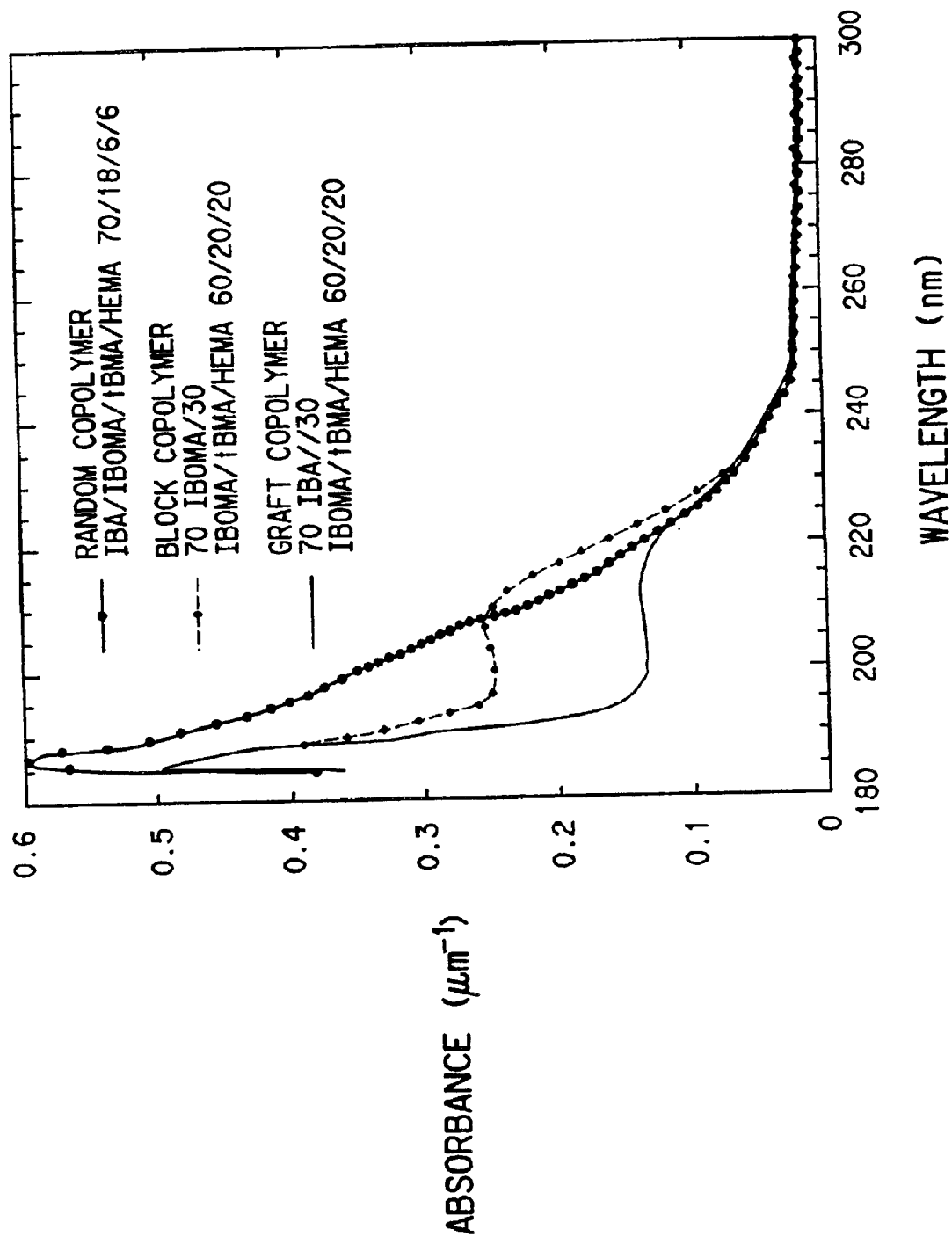

PHOTORESISTS AND PROCESSES FOR MICROLITHOGRAPHY

This application claims benefit of Ser. No. 60/105,789 filed Oct. 27, 1998.

BACKGROUND OF THE INVENTION

1. Field of the Invention

The present invention pertains to photoimaging and to the use of positive-working photoresists, particularly for imaging in the production of semiconductor devices.

2. Description of Related Art

Polymer products are used as components of imaging and photosensitive systems and particularly in photoimaging systems such as those described in *Introduction to Microlithography, Second Edition* by L. F. Thompson, C. G. Willson, and M. J. Bowden, American Chemical Society, Washington, D.C., 1994. In such systems, ultraviolet (UV) light or other electromagnetic radiation impinges on a material containing a photoactive component to induce a physical or chemical change in that material. An image or latent image is thereby produced which can be used for semiconductor device fabrication.

Although the polymer product itself may be photoactive, generally a photosensitive composition contains one or more photoactive components in addition to the polymer product. Upon exposure to electromagnetic radiation (e.g., UV light), the photoactive component acts to change the rheological state, the solubility, the surface characteristics, refractive index, the color, the electromagnetic characteristics or other such physical or chemical characteristics of the photosensitive compositions as described in the Thompson et al. publication supra.

For imaging very fine features at the submicron (sub-$\mu$m) level in semiconductor devices, electromagnetic radiation in the deep or vacuum ultraviolet (UV) is typically employed. Positive working resists generally are utilized for semiconductor manufacture. Lithography in the violet or the UV at 365 nm (I-line) using novolak polymers and diazonaphthoquinones as dissolution inhibitors is a currently established chip technology having a resolution limit of about 0.35–0.30 $\mu$m. Lithography in the deep UV (DUV) at 248 nm using p-hydroxystyrene polymers is known and has a resolution limit of 0.35–0.18 $\mu$m. There is a strong impetus for future photolithography at even shorter wavelengths, due to decreasing lower resolution limit with decreasing wavelength (i.e., a resolution limit of 0.18–0.13 $\mu$m for 193 nm imaging). Photolithography using 193 nm exposure wavelength (obtained from an argon fluorine (Ar-F) excimer laser) is a leading candidate for future microelectronic fabrication using 0.18 and 0.13 $\mu$m design rules. Photolithography using 157 nm exposure wavelength (obtained using an $F_2$ laser source) may be used for future microelectronics fabrication using 0.100 $\mu$m or less design rules. The opacity of traditional UV and deep-UV organic photoresists at 193 nm precludes their use in single-layer schemes at this wavelength. Recently new photoresist compositions comprising cycloolefin-maleic anhydride alternating copolymers have been shown to be useful for imaging of semiconductors at 193 nm (see F. M. Houlihan et al., *Macromolecules*, 30, pages 6517–6534 (1997); T. Wallow et al., SPIE, Vol. 2724, pages 355–364; and F. M. Houlihan et al., *Journal of Photopolymer Science and Technology*, 10, No. 3, pages 511–520 (1997)).

Comb polymers are a particular class of branched polymers wherein one or more branch (polymer) segments are linked along a linear (polymer) backbone segment. Comb polymers may also be described as linear polymers with polymeric arms. Such polymers typically are prepared by copolymerizing a conventional monomer with a macromer. Macromers are defined by Kawakami in the "Encyclopedia Of Polymer Science And Engineering", Vol. 9, pp. 195–204 (John Wiley & Sons, New York, 1987) to be polymers of molecular weight ranging from several hundred to tens of thousands, with a functional group at the end that can further polymerize, such as an ethylenic, an epoxy, a dicarboxylic acid, a diol or a diamino group. U.S. Pat. No. 5,061,602 discloses the use of such a polymer as a binding agent in a negative-working photopolymerizable material suitable for producing printing forms or resist patterns. The polymer binder disclosed consists of a film-forming copolymer that has a multi-phase morphology where at least one phase has a glass transition temperature below room temperature and at least one other phase has a glass transition temperature above room temperature. The copolymer has an average molecualar weight (weight average) or more than 10,000, and is produced using an ethylenically unsaturated macromer with an average molecular weight (weight average) of 1000 to 100,000. The use of graft (comb) copolymers having acid functionality in certain negative-working photosensitive compositions, such as solder masks, has published (see PCT International Publication No. WO 92/15628.

M. Yamana et al., *Deblocking Reaction of Chemically Amplified ArF Positive Resists,* PROC. SPIE-INT. SOC. OPT. ENG., Vol. 3333, No. 1, pages 32–42 (June 1998) discloses deblocking reaction mechanisms and lithographic performance in chemically amplified positive ArF resists consisting of triphenylsulfonium triflate as an acid generator and the copolymer poly(carboxytetracyclododecyl methacrylate$_{70}$-co-tetrahydropyranylcarboxy-tetracyclododecyl methacrylate$_{30}$). EP 0 473 547 A (CIBA-GEIGY AG 4 Mar. 1992) discloses certain olefinically unsaturated onium salts which can be polymerized and used as photosensitive copolymers in photoresist compositions. The photosensitive copolymers disclosed include branch copolymers containing protected acid groups and acid-generating groups.

There is a critical need though for other novel resist compositions for use at 193 nm or lower, and particularly at 157 nm, that have not only high transparency at these short wavelengths but also other suitable key properties, including good plasma etch resistance and adhesive properties. This invention addresses this critical need by providing new advantageous compositions and associated processes, comprising graft (comb) copolymers, which have these key properties.

SUMMARY OF THE INVENTION

The present invention comprises:

(A) a branched polymer containing protected acid groups, said polymer comprising one or more branch segment(s) chemically linked along a linear backbone segment, wherein the branch segment(s) contain at least two repeating monomer units and have a number average molecular weight ($M_n$) of least 1000.

(B) at least one photoacid generator. In another embodiment, the invention is a positive photoresist as described supra wherein the photoacid generator is covalently bonded to the branched polymer. The invention also includes a process for preparing a photoresis image on a substrate comprising, in order:

(W) applying a photoresist composition on a substrate, wherein the photoresist composition comprises:

(a) a branched polymer containing protected acid groups, said polymer comprising one or more branch segment(s) chemically linked along a linear backbone segment, wherein the branched polymer contains sufficient functionality to render the photoresist developable to afford a relief image, upon imagewise exposure to violet or ultraviolet radiation and subsequent heating, and wherein the branch segment(s) contain at least two repeating monomer units and have a number average molecular weight ($M_n$) of at least 1000;

(b) at least one photoacid generator; and (c) a solvent;

(X) drying the coated photoresist composition to remove solvent and thereby to form a photoresist layer on the substrate;

(Y) imagewise exposing the photoresist layer to form imaged and non-imaged areas; and (Z) developing the exposed photoresist layer having imaged and non-imaged areas to form the relief image on the substrate.

The photoresist compositions of this invention have a particularly good balance of desirable properties, including high transparency to near, far, and extreme ultraviolet light, high plasma etch resistance, and projected high resolution characteristics suitable for microelectronic device fabrication.

BRIEF DESCRIPTION OF THE DRAWINGS

FIG. 1 is a plot of absorbance ($\mu m^{-1}$) versus wavelength (nm) in the UV region for corresponding random, block, and graft copolymers having the same or similar comonomer compositions.

DETAILED DESCRIPTION OF THE PREFERRED EMBODIMENT(S)

Each photosensitive composition of this invention contains a branched polymer, also known as a comb polymer, which contains protected acid groups. The branched polymer has branch segments, known as polymers arms, of limited molecular weight and limited weight ratio relative to a linear backbone segment. In a preferred embodiment, a majority of the protected acid groups are present in the branch segments. The composition also contains a component, such as a photoacid generator, which renders the composition reactive to radiant energy, especially to radiant energy in the ultraviolet region of the electromagnetic spectrum and most especially in the far or extreme ultraviolet regions.

Branched Polymer

The branched polymer that is a component in each photosensitive composition of this invention contains protected acid groups and comprises one or more branch segment(s) chemically linked along a linear backbone segment. The branched polymer can be formed during free radical addition polymerization of at least one ethylenically unsaturated macromer component and at least one ethylenically unsaturated comonomer. The ethylenically unsaturated macromer component has a number average molecular weight ($M_n$) between a few hundred and 40,000 and the linear backbone segment resulting from the polymerization has a number average molecular weight ($M_n$) between about 2,000 and 500,000. The weight ratio of the linear backbone segment to the branch segment(s) is within a range of about 50/1 to about 1/10, and preferably within the range of about 80/20 to about 60/40. Preferably the macromer component has a number average molecular weight ($M_n$) from 500 to about 40,000 and more preferably of about 1,000 to about 15,000. Typically such an ethylenically unsaturated macromer component can have a number average molecular weight ($M_n$) equivalent to there being from about 2 to about 500 monomer units used to form the macromer component and preferably between 30 and 200 monomer units.

In a preferred embodiment, the branched polymer contains from 25% to 100% by weight of compatibilizing groups, i.e., functional groups present to increase compatibility with the photoacid generator, preferably from about 50% to 100% by weight, and more preferably from about 75% to 100% by weight. Suitable compatibilizing groups for ionic photoacid generators include, but are not limited to, both non-hydrophilic polar groups and hydrophilic polar groups. Suitable non-hydrophilic polar groups include, but are not limited to, cyano (—CN) and nitro (—$NO_2$). Suitable hydrophilic polar groups include, but are not limited to protic groups such as hydroxy (OH), amino ($NH_2$), ammonium, amido, imido, urethane, ureido, or mercapto; or carboxylic ($CO_2H$), sulfonic, sulfinic, phosphoric, or phosphoric acids or salts thereof. Preferably, compatibilizing groups are present in the branch segment(s).

Preferably, the protected acid groups (described infra) produce carboxylic acid groups after exposure to UV or other actinic radiation and subsequent post-exposure baking (i.e., during deprotection). The branched polymer present in the photosensitive compositions of this invention, typically will contain between about 3% to about 40% by weight of monomer units containing protected acid groups, preferably between about 5% to about 50%, and more preferably between about 5% to about 20%. The branch segments of such a preferred branched polymer typically contain between 35% to 100% of the protected acid groups present. Such a branched polymer when completely unprotected (all protected acid groups converted to free acid groups) has an acid number between about 20 and about 500, preferably between about 30 and about 330, and more preferably between about 30 and about 130, and analogously the ethylenically unsaturated macromer component preferably has an acid number between about 20 and about 650, more preferably between about 90 and about 300 and the majority of the free acid groups are in the branch segments.

In a specific embodiment, the branched polymer comprises one or more branch segments chemically linked along a linear backbone segment wherein the branched polymers have a number average molecular weight ($M_n$) of about 500 to 40,000. The branched polymer contains at least 0.5% by weight of branch segments. The branch segments, also known as polymer arms, typically are randomly distributed along the linear backbone segment. The "polymer arm" or branch segment is a polymer or oligomer of at least two repeating monomer units, which is attached to the linear backbone segment by a covalent bond. The branch segment, or polymer arm, can be incorporated into the branched polymer as a macromer component, during the addition polymerization process of a macromer and a comonomer. A "macromer" for the purpose of this invention, is a polymer, copolymer or oligomer of molecular weight ranging from several hundred to about 40,000 containing a terminal ethylenically unsaturated polymerizable group. Preferably the macromer is a linear polymer or copolymer end capped with an ethylenic group. Typically, the branched polymer is a copolymer bearing one or more polymer arms, and preferably at least two polymer arms, and is characterized in that between about 0.5 and about 80 weight %, preferably between about 5 and 50 weight % of the monomeric components used in the polymerization process is a macromer. Typically, comonomer components used along with the macromer in the polymerization process likewise contains a single ethylenic group that can copolymerize with the ethylenically unsaturated macromer.

The ethylenically unsaturated macromer and the resulting branch segment of the branched copolymer, and/or the backbone of the branched polymer, can have bonded thereto one or more protected acid groups. For the purposes of this invention, a "protected acid group" means a functional group which, when deprotected, affords free acid functionality that enhances the solubility, swellability, or dispersibility in aqueous environments, of the macromer and/or the branched polymer to which it is bonded. The protected acid group may be incorporated into the ethylenically unsaturated macromer and the resulting branch segment of the branched polymer, and/or the backbone of the branched polymer, either during or after their formation. While addition polymerization using a macromer and at least one ethylenically unsaturated monomer is preferred for forming the branched polymer, all known methods of preparing branched polymers using either addition or condensation reactions can be utilized in this invention. Furthermore, use of either preformed backbones and branch segments or in situ polymerized segments are also applicable to this invention.

The branch segments attached to the linear backbone segment can be derived from ethylenically unsaturated macromers prepared according to the general descriptions in U.S. Pat. No. 4,680,352 and U.S. Pat. No. 4,694,054. Macromers are prepared by free radical polymerization processes employing a cobalt compound as a catalytic chain transfer agent and particularly a cobalt(II) compound. The cobalt(II) compound may be a pentacyanocobalt(II) compound or a cobalt(II) chelate of a vicinal iminohydroxyimino compound, a dihydroxyimino compound, a diazadihydroxyiminodialkyldecadiene, a diazadihydroxyiminodialkylundecadiene, a tetraazatetraalkylcyclotetradecatetraene, a tetraazatetraalkylcyclododecatetraene, a bis(difluoroboryl) diphenyl glyoximato, a bis(difluoroboryl) dimethyl glyoximato, a N,N'-bis(salicylidene)ethylenediamine, a dialkyldiaza-dioxodialkyldodecadiene, or a dialkyldiaza-dioxodialyltridecadiene. Low molecular weight methacrylate macromers may also be prepared with a pentacyanocobalt(II) catalytic chain transfer agent as disclosed in U.S. Pat. No. 4,722,984.

Illustrative macromers using this approach are methacrylate polymers with acrylates or other vinyl monomers wherein the polymers or copolymers have a terminal ethylenic group and a hydrophilic functional group. Preferred monomer components for use in preparing macromers include: tertiary-butyl methacrylate (tBMA), tertiary-butyl acrylate (tBA), methyl methacrylate (MMA); ethyl methacrylate (EMA); butyl methacrylate (BMA); 2-ethylhexyl methacrylate; methyl acrylate (MA); ethyl acrylate (EA); butyl acrylate (BA); 2-ethylhexyl acrylate; 2-hydroxyethyl methacrylate (HEMA); 2-hydroxyethyl acrylate (HEA); methacrylic acid (MAA); acrylic acid (AA); esters of acrylic and methacrylic acid wherein the ester group contains from 1 to 18 carbon atoms; nitriles and amides of acrylic and methacrylic acid (e.g., acrylonitrile); glycidyl methacrylate and acrylate; itaconic acid (IA) and itaconic acid anhydride (ITA), half ester and imide; maleic acid and maleic acid anhydride, half ester and imide; aminoethyl methacrylate; t-butyl aminoethyl methacrylate; dimethyl aminoethyl methacrylate; t-butyl aminoethyl methacrylate; dimethyl aminoethyl mathacrylate; diethyl aminoethyl methacrylate; aminoethyl acrylate; dimethyl aminoethyl arylate; diethyl aminoethyl acrylate; acrylamide; N-t-octyl acrylamide; vinyl methyl ether; styrene (STY); alpha-methyl styrene (AMS); vinyl acetate; vinyl chloride and the like.

Itaconic acid anhydride (ITA, 2-methylenesuccinic anhydride, CAS No.=2170-03-8) is a particularly advantageous comonomer for use in the branched polymer since it has two active functional groups in the anhydride form, which becomes three upon ring opening to afford diacid. The ethylenically unsaturated moiety is a first functional group, which provides capability for this comonomer to be incorporated into a copolymer by, for example, free radical polymerization. The anhydride moiety is a second functional group that is capable of reacting with a variety of other functional groups to afford covalently bonded products. An example of a functional group that an anhydride moiety can react with is a hydroxy group in an alcohol to form an ester linkage. Upon reaction of the anhydride moiety of ITA with a hydroxy group, there is formed an ester linkage and a free carboxylic acid moiety, which is a third functional group. The carboxylic acid functional group is useful in imparting aqueous processability to the resists of this invention. If a PAG is utilized having a hydroxy group, it is possible, as illustrated in some of the examples, to covalently link (tether) a PAG (or other photoactive components) to a branched polymer comprised of ITA comonomer or the like via this type of ester linkage (or other covalent linkages, such as amides, etc.).

The branched polymer may be prepared by any conventional addition polymerization process. The branched polymer, or comb polymer, may be prepared from one or more compatible ethylenically unsaturated macromer components and one or more compatible, conventional ethylenically unsaturated comonomer component(s). Preferred addition polymerizable, ethylenically unsaturated comonomer components are acrylates, methacrylates, and styrenics as well as mixtures thereof. Suitable addition polymerizable, ethylenically unsaturated comonomer components include: tertiary-butyl methacrylate (tBMA), tertiary-butyl acrylate (tBA), methyl methacrylate (MMA); ethyl methacrylate (EMA); butyl methacrylate (BMA); 2-ethylhexyl methacrylate; methyl acrylate (MA); ethyl acrylate (EA); butyl acrylate; (BA); 2-ethylhexyl acrylate; 2-hydroxyethyl methacrylate (HEMA); 2-hydroxyethyl acrylate (HEA); methacrylic acid (MAA); acrylic acid (AA); acrylonitrile (AN); methacrylonitrile (MAN); itaconic acid (IA) and itaconic acid anhydride (ITA), half ester and imide; maleic acid and maleic acid anhydride, half ester and imide; aminoethyl methacrylate; t-butyl aminoethyl methacrylate; dimethyl aminoethyl methacrylate; diethyl aminoethyl methacrylate; aminoethyl acrylate; dimethyl aminoethyl acrylate; diethyl aminoethyl acrylate; acrylamide; N-t-ocyl acrylamide; vinyl methyl ethers; styrene (S); alpha-methyl styrene; vinyl acetate; vinyl chloride; and the like. The majority of the copolymerizable monomer must be acrylate or styrenic or copolymers of these monomers with acrylates and other vinyl monomers.

Each constituent linear backbone segment and/or branch segment of the branched polymer of this invention may contain a variety of functional groups. A "functional group" is considered to be any moiety capable of being attached to a backbone segment or a branch segment by a direct valence bond or by a linking group. Illustrative of functional groups which can be borne by the backbone segment or the branch segments are —COOR; —OR; —SR (where R can be hydrogen, alkyl or cycloalkyl of 1–12 carbon atoms, alkyl, aralkyl or aralkyl, a heterocyclic, or —OR$_1$ where R$_1$ can be alkyl of 1–12 carbon atoms, aryl, aralkyl or aralkyl); —CN; —NR$_2$R$_3$ or

(where R$_2$ and and R$_3$ can be hydrogen, alkyl or cycloalkyl of 1–12 carbon atoms, aryl, alkaryl, aralkyl, —CH$_2$OR$_4$ (where R$_4$ is hydrogen, alkyl or cycloalkyl of 1–12 carbon atoms, aryl, alkaryl, aralkyl), or together R$_2$ and R$_3$ can form a heterocyclic ring);

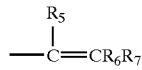

(where R$_5$, R$_6$ and R$_7$ can be hydrogen, alkyl or cycloalkyl of 1–12 carbon atoms, aryl, alkaryl, aralkyl, or —COOR or when taken together R$_5$, R$_6$ and/or R$_7$ can form a cyclic group); —SO$_3$H; a urethane group; an isocyanate or blocked isocyanate group; a urea group; an oxirane group; an aziridine group; a quinone diazide group; an azo group; an azide group; a diazonium group; an acetylacetoxy group; —SiR$_8$R$_9$R$_{10}$ (where R$_8$, R$_9$ and R$_{10}$ can be alkyl or cycloalkyl of 1–12 carbon atoms or —OR$_{11}$ where R$_{11}$ is alkyl or cycloalkyl of 1–12 carbon atoms, aryl, alkaryl or aralkyl); or an —OSO$_3$R$_{12}$, —OPO$_2$R$_{12}$, —PO$_2$R$_{12}$, —PR$_{12}$R$_{13}$R$_{14}$, —OPOR$_{12}$, —SR$_{12}$R$_{13}$, or —N+R$_{12}$R$_{13}$R$_{14}$ group (where R$_{12}$, R$_{13}$ and R$_{14}$ can be hydrogen, alkyl or cycloalkyl of 1–12 carbon atoms, aryl, alkaryl or aralkyl); or a salt or onium salt of any of the foregoing. Preferred functional groups are —COOH, —OH, —NH$_2$, an amide group, a vinyl group, a urethane group, an isocyanate group, a blocked isocyanate group or combinations thereof. Functional groups may be located anywhere on the branched polymer. However, it is sometimes desirable to choose comonomers which impart bulk polymer characteristics to the linear backbone segment of the branched polymer and macromers which impart physical and chemical functionality to the branch segments in addition to hydrophilicity, such as solubility, reactivity, and the like.

In certain preferred embodiments of this invention, the branched polymer contains functional groups that are compatible with the photoacid generator, said functional groups being distributed in the branched polymer such that 25 to 100% of the functional groups are present kin the segment of the branched polymer containing a majority of the protected acid groups. These functional groups are desirable since having enhanced compatibility of the photoacid generator with the branched polymer segmented having the majority of protected acid groups results in higher photospeed and perhaps higher resolution and/or other desirable properties of resists comprised of these branched polymer(s) having these functional groups to promote compatibility. For an ionic PAG, such as a triarylsulfonium salt, functional groups that promote compatibility include, but are not limited to, polar non-hydrophilic groups (e.g., nitro or cyano) and polar hydrophilic groups (e.g., hydroxy, carboxyl). For a nonionic PAG, such as structure III infra, preferred functional groups for imparting compatibility are less polar than the polar groups listed above. For the latter case, suitable functional groups include, but are not limited to, groups which impart rather similar chemical and physical properties to those of the non-ionic PAG. As two specific examples, aromatic and perfluoroalkyl functional groups are effective in promoting compatibility of the branched polymer with a nonionic PAG, such as structure III given infra.

In some preferred embodiments, the branched polymer is an acrylic/methacrylic/styrenic copolymer being at least 60% by weight acrylate and having at least 60% of methacrylate repeat units present either in a first location or a second location, the first location being one of the segments (i.e., branch segment(s) or linear backbone segment), the second location being a segment different from the first location, wherein at least 60% of the acrylate repeat units are present in the second location.

In some embodiments, the branched polymer is a fluorine-containing graft copolymer comprising a repeat unit derived from at least one ethylenically unsaturated compound containing at least one fluorine atom covalently attached to an ethylenically unsaturated carbon atom. The repeat unit bearing at least one fluorine atom can be either in the linear polymer backbone segment or in the branched polymer segment(s); preferably, it is in the linear polymer backbone segment. Representative ethylenically unsaturated compounds that are suitable for the fluorine-containing graft copolymers of this invention include, but are not limited to, tetrafluoroethylene, chlorotrifluoroethylene, hexafluoropropylene, trifluoroethylene, vinylidene fluoride, vinyl fluoride, and R$_f$OCF=CF$_2$ wherein R$_f$ is a saturated perfluoroalkyl group of from 1 to about 10 carbon atoms. The fluorine-containing copolymers of this invention can be comprised of any integral number of additional fluorine-containing comonomers, which include, but are not limited to, those listed supra. Preferred comonomers are tetrafluoroethylene, chlorotrifluoroethylene, hexafluoropropylene, trifluoroethylene and R$_f$OCF=CF$_2$, wherein R$_f$ is a saturated perfluoroalkyl group of from 1 to about 10 carbon atoms. More preferred comonomers are tetrafluoroethylene, chlorotrifluoroethylene, hexafluoropropylene, and R$_f$OCF=CF$_2$, wherein R$_f$ is a saturated perfluoroalkyl group of from 1 to about 10 carbon atoms. Most preferred comonomers are tetrafluoroethylene and chlorotrifluoroethylene.

In some preferred embodiments, the fluorine-containing graft copolymer is further comprised of a repeat unit derived from at least one unsaturated compound selected from the group consisting of:

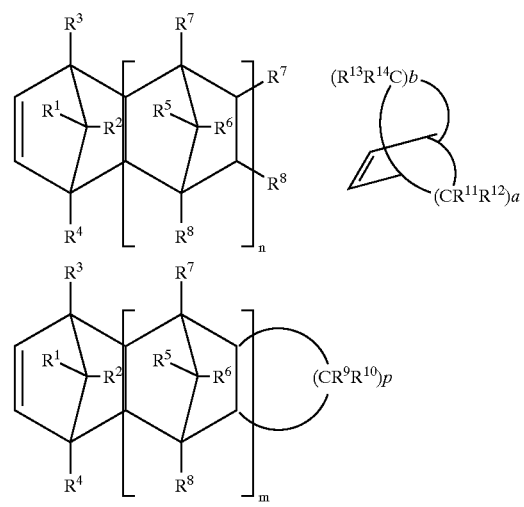

CH$_2$=CHO$_2$CR$^{15}$  CH$_2$=CHOCH$_2$R$^{15}$  CH$_2$=CHOR$^{15}$ and

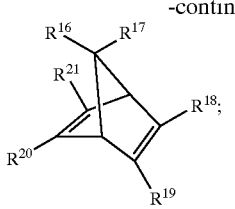

wherein:
  each of m and n is 0, 1 or 2, p is an integer of at least 3;
  a and b are independently 1 to 3 except that a is not=1 when b=2 or vice versa;
  $R^1$ to $R^{14}$ are the same or different and each represents a hydrogen atom, a halogen atom, a carboxyl group, a $C_1$ to $C_{14}$ secondary or tertiary alkyl carboxylate, a hydrocarbon group or a substituted hydrocarbon group;
  $R^{15}$ is a saturated alkyl group of about 4 to 20 carbon atoms, optionally containing one or more ether oxygens with the proviso that the ratio of carbon atoms to hydrogen atoms is greater than or equal to 0.58; and
  $R^{16}$ to $R^{21}$ are each independently hydrogen atoms, $C_1$ to $C_{12}$ alkyls, $(CH_2)_qCO_2A$, $CO_2(CH_2)_qCO_2A$ or $CO_2A$ wherein q is 1 to 12 and A is hydrogen or an acid protecting group with the proviso that at least one of $R^{18}$ to $R^{21}$ is $CO_2A$. In one embodiment of this invention, a PAG is covalently linked (i.e., tethered) to the fluorine-containing graft copolymer to afford a photoresist.

In some preferred embodiments, the branched polymer is a fluorine-containing copolymer comprising a repeat unit derived from at least one ethylenically unsaturated compound containing a fluoroalcohol functional group having the structure:

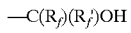
—C(R$_f$)(R$_f'$)OH wherein R$_f$ and R$_f'$ are the same or different fluoroalkyl groups of from 1 to about 10 carbon atoms or taken together are $(CF_2)_n$ wherein n is 2 to 10. A given fluorine-containing branched copolymer comprising a repeat unit derived from at least one ethylenically unsaturated compound containing a fluoroalcohol functional group according to this invention can have fluoroalkyl groups present as part of the fluoroalcohol functional groups. These fluoroalkyl groups are designated as R$_f$ and R$_f'$, which can be partially fluorinated alkyl groups or fully fluorinated alkyl groups (i.e., perfluoroalkyl groups). Broadly, R$_f$ and R$_f'$ are the same or different fluoroalkyl groups of from 1 to about 10 carbon atoms or taken together are $(CF_2)_n$ wherein n is 2 to 10. (In the last sentence, the terms "taken together" indicate that R$_f$ and R$_f'$ are not separate, discrete fluorinated alkyl groups, but that together they form a ring structure such as is illustrated below in case of a 5-membered ring.

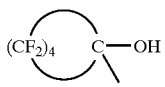

R$_f$ and R$_f'$ can be partially fluorinated alkyl groups without limit according to the invention except that there must be a sufficient degree of fluorination present to impart acidity to the hydroxyl (—OH) of the fluoroalcohol functional group, such that the hydroxyl proton is substantially removed in basic media, such as in aqueous sodium hydroxide solution or tetraalkylammonium hydroxide solution. In preferred cases according to the invention, there will be sufficient fluorine substitution present in the fluorinated alkyl groups of the fluoroalcohol functional group such that the hydroxyl group will have a pKa value as follows: 5<pKa<11. Preferably, R$_f$ and R$_f'$ are independently perfluoroalkyl group of 1 to 5 carbon atoms, and, most preferably, R$_f$ and R$_f'$ are both trifluoromethyl ($CF_3$). Preferably, each fluorine-containing copolymer according to this invention has an absorption coefficient of less than 4.0 $\mu m^{-1}$ at a wavelength of 157 nm, preferably of less than 3.5 $\mu m^{-1}$ at this wavelength, and, more preferably, of less than 3.0 $\mu m^{-1}$ at this wavelength.

The fluorinated polymers, photoresists, and processes of this invention that involve a fluoroalcohol functional group may have the structure:

—XCH$_2$C(R$_f$)(R$_f'$)OH wherein R$_f$ and R$_f'$ are the same or different fluoroalkyl groups of from 1 to about 10 carbon atoms or taken together are $(CF_2)_n$ wherein n is 2 to 10; X is selected from the group consisting of oxygen, sulfur, nitrogen, phosphorus, other Group Va element, and other Group VIa element. By the terms "other Group Va element" and "other Group VIa element", these terms are understood to mean herein any other element in on of these groups of the periodic table that is other than the recited elements (i.e., oxygen, sulfur, nitrogen, phosphorous) in these groups. Oxygen is the preferred X group.

Some illustrative, but nonlimiting, examples of representative comonomers containing a fluoroalcohol functional group and within the scope of the invention are presented below:

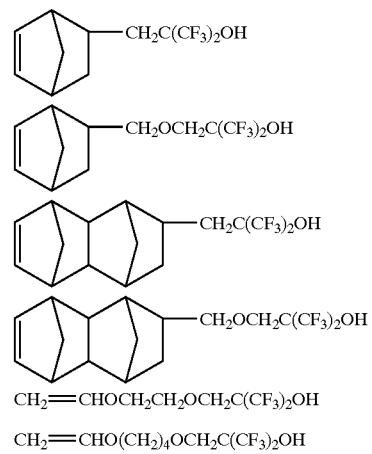

$CH_2$=$CHOCH_2CH_2OCH_2C(CF_3)_2OH$ $CH_2$=$CHO(CH_2)_4OCH_2C(CF_3)_2OH$

As is well known to those skilled in the polymer art, an ethylenically unsaturated compound undergoes free radical polymerization to afford a polymer having a repeat unit that is derived form the ethylenically unsaturated compound. Specifically, an ethylenically unsaturated compound having structure:

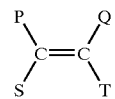

that undergoes free radical polymerization will afford a polymer having a repeat unit:

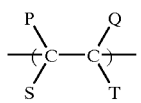

where P, Q, S, and T independently can represent, but are not limited to, H, F, Cl, Br, $CO_2R_e$ ($R_e=C_1-C_{12}$ alkyl), alkyl, aryl, aralkyl and cycloalkyl. If only one ethylenically unsaturated compound undergoes polymerization, the resulting polymer is a homopolymer. If two or more distinct ethylenically unsaturated compounds undergo polymerization, the resulting polymer is a copolymer. Some representative examples of ethylenically unsaturated compounds and their corresponding repeat units are given below:

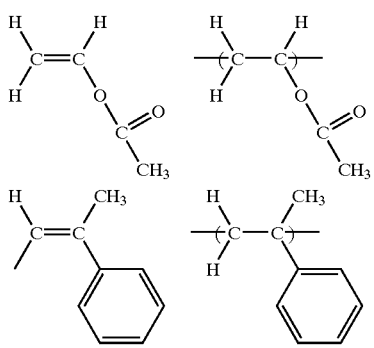

Photosensitive Compositions

The branched polymers are particularly useful in photosensitive compositions containing at least one photoactive component and in particular in photosensitive compositions, such as lithographic photoresists and the like, which will be further described to illustrate this invention. "Photoactive", which is synonymous with "photosensitive", describes a material which changes its chemical or physical nature, or causes such a change, upon exposure to actinic radiation, in such a way that the change is formed directly, e.g., an image, or that a precursor, e.g., a latent image, is formed which upon further treatment produces the desired change. Illustrative of such a photoactive component is a material which cyclizes, dimerizes, polymerizes, crosslinks, generates a free radical, generates an acid or other ionic species or dissociates upon exposure to actinic radiation (e.g., UV light). A photoactive or photosensitive component includes a photoinitiator, a photosensitizer or a combination thereof; a photoacid generator (PAG), a photosolubilizer, a photodesensitizer; a photoinhibitor; a phototackifier; a photodetackifier; or a component which is photodegradable; photochromic; photoreducible; photooxidizable, photoadhesive; photoreleasable; photomagnetic; photodemagntic photoconductive or photoinsulative; or is a material which changes or causes changes in refractive index upon exposure to actinic radiation. The photosensitive compositions of this invention include those instances in which component (B) is bonded to component (A); or in which component (B) has greater compatibility with the segment of the branched polymer that contains the major portion of acid protected groups.

The branched polymers are useful as components of photosensitive systems and particularly in photoimaging systems such as those described in *Introduction to Microlithography, Second Edition* by L. F. Thompson, C. G. Willson, and M. J. Bowden, American Chemical Society, Washington, D.C., 1994. In such systems, actinic radiation impinges on a material containing a photoactive component to induce a physical or chemical change in that material. An image or latent image which can be processed into a useful image can thereby be produced. Typically actinic radiation useful for imaging is light ranging from the extreme ultraviolet through the visible spectral regions, but may also include infrared, X-ray and electron beam radiation. Although the branched polymer itself may be photoactive, as in some embodiments of this invention, often a photosensitive composition contains one or more photoactive components in addition to the branched polymer. Upon exposure to actinic radiation, the photoactive component acts to change the rheological state, the solubility, the surface characteristics, refractive index, the color, the electromagnetic characteristics or other such physical or chemical characteristics of the photosensitive composition as described in the aforementioned Thompson et al. publication.

The photosensitive composition of this invention may be applied as a neat, solvent-free, photosensitive liquid or as a solution and dried to a solid layer wherein any conventional coating or printing process may be used. Alternatively, the photosensitive composition may be applied as a dry film in a layer. Alternatively, the layer or film may be applied by laminating a supported solid photosensitive layer to the substrate and then optionally removing the support.

Photoactive Component (PAC)

The compositions of this invention contain at least one photoactive component (PAC) that is a compound which affords acid upon exposure to actinic radiation and which is termed a photoacid generator (PAG). Suitable photoacid generators for this invention include, but are not limited to, 1) sulfonium salts (structure I), 2) iodonium salts (structure II), and 3) hydroxamic acid esters, such as structure III.

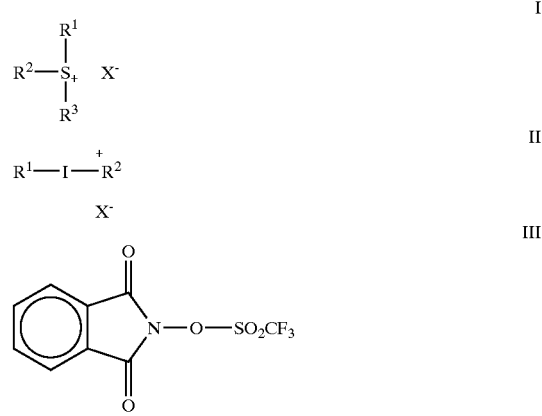

In structures I–II, $R^1$–$R^3$ are independently substituted or unsubstituted aryl or substituted or unsubstituted $C_1-C_{20}$ alkylaryl (aralkyl). Representative aryl groups include, but are not limited to, phenyl and naphthyl. Suitable substituents include, but are not limited to, hydroxyl (—OH) and $C_1-C_{20}$ alkyloxy (e.g., $C_{10}H_{21}O$). The anion X— in structures I–II can be, but is not limited to, $SbF_6$-(hexafluoroantimonate), $CF_3SO_3$-(trifluoromethylsulfonate=triflate), and $C_4F_9SO_3$-(perfluorobutylsulfonate).

Protective Groups for Removal by PAC Catalysis

The branched polymer of this invention may contain one or more components having protected acid groups that can yield, by catalysis of acids or bases generated photolytically from photoactive compounds (PACs), hydrophilic acid groups which enable development of resist coatings. A given protected acid group is one that is normally chosen on the basis of its being acid labile, such that when photoacid is produced upon imagewise exposure, the acid will catalyze deprotection and production of hydrophilic acid groups that are necessary for development under aqueous conditions. In addition, the graft copolymer may also contain acid functionality that is not protected.

Examples of components having protected acid groups that yield a carboxylic acid as the hydrophilic group upon exposure to photogenerated acid include, but are not limited to, A) esters capable of forming, or rearranging to, a tertiary cation, B) esters of lactone, C) acetal esters, D) β-cyclic ketone esters, E) α-cyclic ether esters, and F) MEEMA (methoxy ethoxy ethyl methacrylate) and other esters which are easily hydrolyzable because of anchimeric assistance. Some specific examples in category A) are t-butyl ester, 2-methyl-2-adamantyl ester, and isobornyl ester. Some specific examples in category B) are γ-butyrolactone-3-yl, γ-butyrolactone-2-yl, mevalonic lactone, 3-methyl-γ-butyrolactone-3-yl, 3-tetrahydrofuranyl, and 3-oxocyclohexyl. Some specific examples in category C) are 2-tetrahydropyranyl, 2-tetrahydrofuranyl, and 2,3-propylenecarbonate-1-yl. Additional examples in category C) include various esters from additional of vinyl ethers, such as, for example, ethoxy ethyl vinyl ether, methoxy ethoxy ethyl vinyl ether, and acetoxy ethoxy ethyl vinyl ether. Examples of components having protected acid groups that yield either a phenol or alcohol as the hydrophilic group upon exposure to photogenerated acid or base include, but are not limited to, t-butoxycarbonyl (t-BOC), t-butyl ether, and 3-cyclohexenyl ether.

In this invention, often, but not always, the components having protected groups are repeat units having protected acid groups that have been incorporated in the base copolymer resins of the compositions (as discussed supra). Frequently the protected acid groups are present in one or more comonomer(s) that are polymerized to form a given copolymeric base resin of this invention. Alternatively, in this invention, a copolymeric base resin can be formed by copolymerization with an acid-containing comonomer and then subsequently acid functionality in the resulting acid-containing copolymer can be partially or wholly converted by appropriate means to derivatives having protected acid groups. As one specific example, a graft copolymer of (70) IBA//(30) IBOMA/tBMA/HEMA 60/20/20 is a copolymeric base resin within the scope of the invention having t-butyl ester groups as protected-acid groups.

It is preferred that one of the segments of the branched polymer contains greater than 50% of the protected acid groups present in the branched polymer. It is more preferred that one of the segments contains at least 75% of the protected acid groups present in the branched polymer. Protected acid groups can be present in either the branch segment(s) (i.e., polymer arms) or in the linear backbone segment; preferably, protected acid groups are located in the branch polymer segment(s).

Deprotection in this invention entails converting protected acid groups of the branched polymer (that is present in photosensitive compositions) in exposed areas substantially or totally into free acid groups, which thereby impart aqueous developability to the photosensitive composition containing the branched polymer. Generally, a post-exposure bake is required and is utilized to effect deprotection. Typically, following imagewise exposure, a given sample is treated at approximately 25° C. to 150° C. for approximately 30 seconds to 600 seconds to effect deprotection. While not limiting the invention, the following explanation of deprotection is believed to occur. Imagewise exposure to UV light results in formation of free acid from the PAG in exposed areas. Protected acid groups in exposed areas containing free acid undergo deprotection to afford sufficient free acid groups on the branched polymer, such that is subsequently developable in alkaline developer solution.

Dissolution Inhibitors and Additives

Various dissolution inhibitors can be utilized in this invention. Ideally, dissolution inhibitors (DIs) for far and extreme UV resists (e.g., 193 nm resists) should be designed/chosen to satisfy multiple materials needs including dissolution inhibition, plasma etch resistance, and adhesion behavior of resist compositions comprising a given DI additive. Some dissolution inhibiting compounds also serve as plasticizers in resist compositions.

A variety of bile-salt esters (i.e., cholate esters) are particularly useful as DIs in the compositions of this invention. Bile-salt esters are known to be effective dissolution inhibitors for deep UV resists, beginning with work by Reichmanis et al. in 1983. (E. Reichmanis et al., "The Effect of Substituents on the Photosensitivity of 2-Nitrobenzyl Ester Deep UV Resists", J. Electrochem. Soc. 1983, 130, 1433–1437). Bile-salt esters are particularly attractive choices as DIs for several reasons, including their availability from natural sources, their possessing a high alicyclic carbon content, and particularly for their being transparent in the deep and vacuum UV region, (which essentially is also the far and extreme UV region), of the electromagnetic spectrum (e.g., typically they are highly transparent at 193 nm). Furthermore, the bile-salt esters are also attractive DI choices since they may be designed to have widely ranging hydrophobic to hydrophilic compatibilities depending upon hydroxyl substitution and functionalization.

Representative bile-acids and bile-acid derivatives that are suitable as additives and/or dissolution inhibitors for this invention include, but are not limited to, those illustrated below, which are as follows: cholic acid (IV), deoxycholic acid (V), lithocholic acid (VI), t-butyl deoxycholate (VII), t-butyl lithocholate (VIII), and t-butyl-3-α-acetyl lithocholate (IX). Bile-acid esters, including compounds VII–IX, are preferred dissolution inhibitors in this invention.

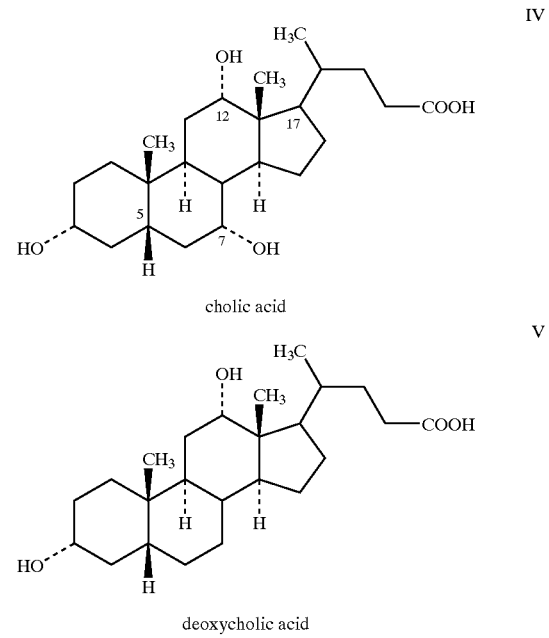

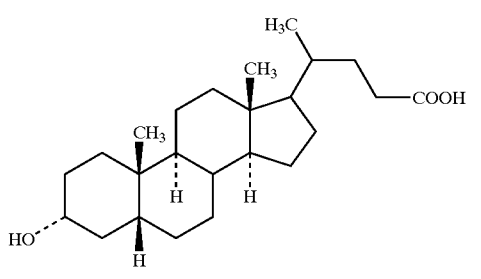

lithocholic acid

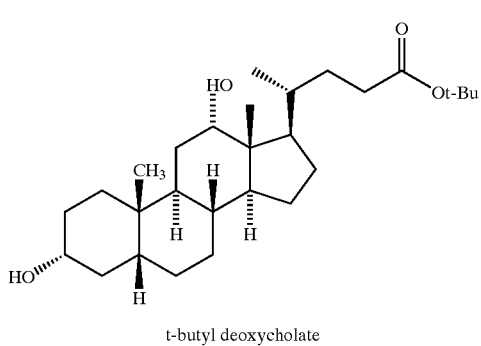

t-butyl deoxycholate

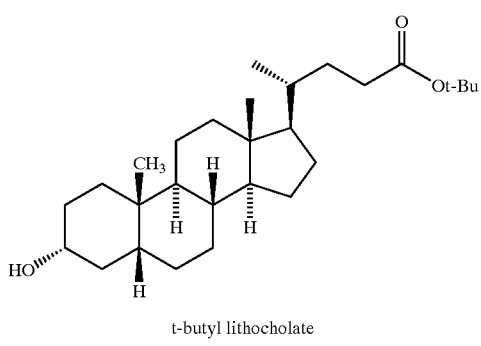

t-butyl lithocholate

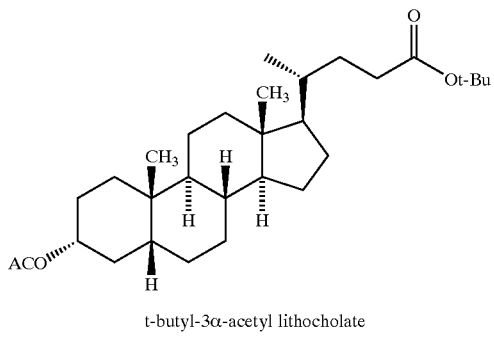

t-butyl-3α-acetyl lithocholate

The invention is not limited to use of bile-acid esters and related compounds as dissolution inhibitors. Other types of dissolution inhibitors, such as various diazonaphthoquinones (DNQs) and diazocoumarins(DCs), can be utilized in this invention in some applications. Diazanaphthoquinones and diazocoumarins are generally suitable in resists compositions designed for imaging at higher wavelengths of UV light (e.g., 365 nm and perhaps at 248 nm). These dissolution inhibitors are generally not preferred in resist compositions designed for imaging with UV light at 193 nm or lower wavelengths, since these compounds absorb strongly in this region of the UV and are usually not sufficiently transparent for most applications at these low UV wavelengths.

Other Components

The compositions of this invention can contain optional additional components. Examples of additional components which can be added include, but are not limited to, resolution enhancers, adhesion promoters, residue reducers, coating aids, plasticizers, and $T_g$ (glass transition temperature) modifiers.

Process Steps

Imagewise Exposure

The photoresist compositions of this invention are sensitive in the ultraviolet region of the electromagnetic spectrum and especially to those wavelengths ≦367 nm. Imagewise exposure of the resist compositions of this invention can be done at many different UV wavelengths including, but not limited to, 365 nm, 248 nm, 193 nm, 157 nm, and lower wavelengths. Imagewise exposure is preferable done with ultraviolet light of 248 nm, 193 nm, 157 nm, or lower wavelengths; is more preferable done with ultraviolet light of 193 nm, 157 nm, or lower wavelengths; and is still more preferably done with ultraviolet light of 157 nm or lower wavelengths. Imagewise exposure can either be done digitally with a laser or equivalent device or non-digitally with use of a photomask. Digital imaging with a laser is preferred. Suitable laser devices for digital imaging of the compositions of this invention include, but are not limited to, an argon-fluorine excimer laser with UV output at 193 nm, a krypton-fluorine excimer laser with UV output at 248 nm, and fluorine (F2) laser with output at 157 nm. Since, as discussed supra, use of UV light of lower wavelength for imagewise exposure corresponds to higher resolution (lower resolution limit), the use of a lower wavelength (e.g., 193 nm or 157 nm or lower) is generally preferred over use of a higher wavelength (e.g., 248 nm or higher). Specifically, imaging at 157 nm is preferred over imageing at 193 nm for this reason.

Development

The graft copolymers in the photoresists of this invention must contain sufficient functionality for development following imagewise exposure to UV light. Preferably, the functionality is acid or protected acid such that aqueous development is possible using a basic developer such as sodium hydroxide solution, potassium hydroxide solution, or ammonium hydroxide solution. Some preferred graft copolymers in the resist compositions of this invention are protected acid-containing copolymers comprised of at least one acid-containing monomer of structural unit:

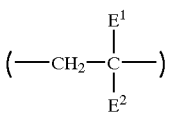

in which $E^1$ is H or $C_1$–$C_{12}$ alkyl; $E^2$ is $CO_2$, $E^3$ is $SO_3E$, or other acidic functional group; and E and $E^3$ are H or $C_1$–$C_{12}$ alkyl, which is unsubstituted or hydroxyl-substituted. Alkyl groups can contain one to twelve carbon atoms and preferably one to eight. A preferred acid-containing binder polymer for aqueous processability (aqueous development) in use is a carboxylic acid-containing copolymer. The level of carboxylic acid groups is determined for a given composition by optimizing the amount needed for good development in aqueous alkaline developer.

When an aqueous processable photoresist is coated or otherwise applied to a substrate and imagewise exposed to UV light, development of the photoresist composition may require that the binder material should contain sufficient acid groups (e.g., carboxylic acid groups) and/or protected acid groups that are at least partially deprotected upon exposure to render the photoresist (or other photoimageable coating composition) processable in aqueous alkaline developer. In case of a positive-working photoresist layer, the photoresist layer will be removed during development in portions which are exposed to UV radiation but will be substantially unaffected in unexposed portions during development by aqueous alkaline liquids such as aqueous solutions containing 0.262 N tetramethylammonium hydroxide (with development at 25° C. usually for less than or equal to 120 seconds) or 1% sodium carbonate by weight (with development at a temperature of 30° C. usually for less than or equal to 2 minutes.

GLOSSARY

Chemicals/Monomers

| | |
|---|---|
| AA | Acrylic acid |
| | Aldrich Chemical Co., Milwaukee, WI |
| 1-AdA | 1-Adamantyl acrylate |
| AIBN | 2,2'-azobisisobutyronitrile |
| | Aldrich Chemical Co., Milwaukee, WI |
| AMS | alpha-Methyl styrene |
| | Aldrich Chemical Co., Milwaukee, WI |
| AMSD | alpha-Methyl styrene dimer |
| | Goi Chemicals Ltd., Houston, TX |
| BuAc | n-Butyl acetate |
| | Aldrich Chemical Co., Milwaukee, WI |
| DMG Co(III) Catalyst | Isopropyl-bis(borondifluoromethyl-glyoximato)cobaltate (III) E.I. du Pont de Nemours, Sydney, Australia |
| HEMA | 2-Hydroxyethyl methacrylate |
| | Aldrich Chemical Co., Milwaukee, WI |
| HMDS | Hexamethyldisilazane |
| | Aldrich Chemical Co., Milwaukee, WI |
| IBA | Isobornyl acrylate |
| | Aldrich Chemical Co., Milwaukee, WI |
| IBOMA | Isobornyl methacrylate |
| | Aldrich Chemical Co., Milwaukee, WI |
| ITA | Itaconic anhydride |
| | Aldrich Chemical Co., Milwaukee, WI |
| MAA | Methacrylic acid |
| | Aldrich Chemical Co., Milwaukee, WI |
| MEK | 2-Butanone |
| | Aldrich Chemical Co., Milwaukee, WI |
| MIBK | Methyl isobutyl ketone |
| | Aldrich Chemical Co., Milwaukee, WI |
| PGMEA | Propylene glycol methyl ether acetate |
| | Aldrich Chemical Co., Milwaukee, WI |
| STY | Styrene |
| | Aldrich Chemical Co., Milwaukee, WI |
| tBA | tertiary-Butyl acrylate |
| tBMA | tertiary-Butyl methacrylate |
| | TCI America, Portland, OR |
| tBPP | tertiary-Butyl perpivalate |
| | Elf Atochem, Philadelphia, PA |
| TMAH | Tetramethylammonium hydroxide Onka NMD-3, 0.238N aqueous solution unless otherwise noted) |
| | Aldrich Chemical Co., Milwaukee, WI |
| Vazo ®52 Initiator | 2,2'-Azobis(2,4-dimethylpentane nitrile) CAS No. 4419-11-8 (E.I. du Pont de Nemours, Wilmington, DE) |
| Vazo ®67 Initiator | 2,2'-Azobis(2-methylbutanenitrile) CAS No. 13472-08-7 (E.I. du Pont de Nemours, Wilmington, DE) |
| Vazo ®88 Initiator | 1,1'-Azobis(Cyclohexanecarbonitrile) CAS No. 2094-98-6 (E.I. du Pont de Nemours, Wilmington, DE) |
| Zonyl ®88 | $C_4$–$C_{10}$ Perfluoro-n-alkyl methacrylate (E.I. du Pont de Nemours, Wilmington, DE) |
| Zonyl ®TAN | $C_4$–$C_{10}$ Perfluoro-n-alkyl acrylate (E.I. du Pont de Nemours, Wilmington, DE) |

General

| | |
|---|---|
| DRM | Dissolution rate monitor - instrument that is designed to accurately measure the rate at which resist is removed during development. This rate is termed the dissolution rate |
| Gm | Gram(s) |
| Min | Minute(s) |
| PAG | Photoacid Generator |
| Sec | Second(s) |
| $M_n$ | Number-average molecular weight of a given polymer |
| $M_w$ | Weight-average molecular weight of a given polymer |
| $P = M_w/M_n$ | Polydispersity (dispersity) of a given polymer Ultraviolet (UV) |
| UV | Ultraviolet region of the electromagnetic spectrum which ranges from 10 nanometers to 390 nanometers |
| Extreme UV | Region of the electromagnetic spectrum in the ultraviolet that ranges from 10 nanometers to 200 nanometers |
| Far UV | Region of the electromagnetic spectrum in the ultraviolet that ranges from 200 nanometers to 300 nanometers |
| Near UV | Region of the electromagnetic spectrum in the ultraviolet that ranges from 300 nanometers to 390 nanometers |

Polymers

| | |
|---|---|
| (70) IBA//(30) IBOMA/tBMA/HEMA 60/20/20 Graft Copolymer | Graft copolymer that is 70% backbone of IBA and 30% sidearms of IBOMA/tBMA/HEMA in amounts of 60%, 20%, and 20%, respectively |
| IBA/IBMOMA/tBMA/HEMA 70/18/6/6 Random Copolymer | Random copolymer containing IBA, IBOMA, tBMA, HEMA in amounts of 70%, 18%, 6%, and 6%, respectively |
| (70)IBOMA//(30)IBOMA/tBMA/HEMA 60/20/20 Block Copolymer | A/B block copolymer having an A block of repeat units derived from IBOMA and a B block of repeat units of IBOMA, tBMA, and HEMA in amounts of 60%, 20%, and 20%, respectively. Polymer contains 70% A block and 30% B block. |
| (70)IBA//(30)IBOMA/tBMA/HEMA 39/41/20 Graft Copolymer | Graft copolymer that is 70% backbone of IBA and 30% sidearms of IBOMA/tBMA/HEMA in amounts of 39%, 41%, and 20%, respectively |
| IBA/IBOMA/tBMA/HEMA 70/12/12/6 Random Copolymer | Random copolymer containing IBA, IBOMA, tBMA, HEMA in amounts of 70%, 12%, 12%, and 6%, respectively |
| (70)IBA//(30)IBOMA/MEEMA 46/54 Graft Copolymer | Graft copolymer that is 70% backbone of IBA and 30% sidearms of IBOMA, and MEEMA in amounts of 46% and 54%, respectively. |
| (70)IBA//(30)IBOMA/tBMA/ITA 51/41/8 Graft Copolymer | Graft copolymer that is 70% backbone of IBA and 30% sidearms of IBOMA, tBMA, and ITA in amounts of 51%, 41%, and 8%, respectively |
| IBA/IBOMA/tBMA/ITA 70/15.3/12.3/2.4 Random Copolymer | Random copolymer containing IBA, IBOMA, tBMA, ITA in amounts of 70%, 15.3%, 12.3%, and 2.4%, respectively. |
| (70)IBA//(30)IBOMA/tBMA/ITA/AMS 47/38.5/7.5/7 Graft Copolymer | Graft copolymer that is 70% backbone of IBA and 30% sidearms of IBOMA, tBMA, ITA, and AMS in amounts of 47%, 38.5%, 7.5%, and 7%, respectively |
| (70)ZONYL ® TAN//(30)IBOMA/tBMA/ITA 56/41/3 Graft Copolymer | Graft copolymer that is 70% backbone of $C_4$–$C_{10}$ perfluoro-n-alkyl acrylate and 30% sidearms of IBOMA, tBMA, and ITA in amounts of 56%, 41%, and 3%, respectively |

-continued

| GLOSSARY | |
|---|---|
| ZONYL ® TAN/IBOMA/ tBMA/ITA 70/16.8/12.3/1 Random Copolymer | Random copolymer containing $C_4$–$C_{10}$ perfluoro-n-alkyl acrylate, IBOMA, tBMA, and ITA in amounts of 70%, 16.8%, 12.3% and 1%, respectively |
| (70)IBA/STY 75/25//(30) IBOMA/tBMA/ITA 51/41/8 Graft Copolymer | Graft copolymer that is 70% backbone of IBA (75%) and STY (25%) and 30% sidearms of IBOMA, tBMA, and ITA in amounts of 51%, 41%, and 8%, respectively |
| IBA/STY/IBOMA/tBMA/ITA 52.5/17.5/15.3/12.3/2.4 Random Copolymer | Random copolymer containing IBA, STY, IBOMA, tBMA, and ITA in amounts of 52.5%, 17.5%, 15.3%, 12.3%, and 2.4%, respectively. |
| IBA/tBMA/HEMA 85.4/7.3/7.3 Random Copolymer | Random copolymer containing IBA, tBMA, and HEMA in amounts of 85.4%, 7.3%, and 7.3%, respectively |
| IBOMA/tBMA/HEMA 60/20/20 Random Copolymer | Random copolymer containing IBOMA, tBMA, and HEMA in amounts of 60%, 20%, and 20%, respectively |
| IBA/IBOMA/HEMA 74.5/19.1/ 6.4 Random Copolymer | Random copolymer containing IBA, IBOMA, and HEMA in amounts of 74.5%, 19.1%, and 6.4%, respectively |
| IBA/IBOMA/tBMA 76/18/6 Random Copolymer | Random copolymer of IBA, IBOMA, and tBMA in amounts of 76%, 18%, and 6%, respectively |
| IBA Homopolymer | Homopolymer of IBA |

EXAMPLES

Unless otherwise specified, all temperatures are in degrees Centigrade (° C.), all mass measurements are in grams, and all percentages are weight percentages.

Example 1

IBOMA/tBMA/HEMA 60/20/20 Macromonomer

The macromonomer was prepared by charging the following components to a 1 liter flask equipped with a thermocouple, stirrer, dropping funnels, reflux condenser, and the means for bubbling nitrogen through the reaction.

| Parts by Weight | Grams |
|---|---|
| Portion 1 | |
| t-butyl methacrylate (tBMA) | 25.98 |
| Isobornyl methacrylate (IBOMA) | 77.94 |
| 2-Hydroxyethyl methacrylate (HEMA) | 25.98 |
| Methyl ethyl ketone (MEK) | 168.74 |
| Portion 2 | |
| Methylethyl ketone(MEK) | 17.41 |
| Isopropyl-bis(borondifluorodimethylglyoximato) cobaltate (III) Catalyst (DMG Co(III)) | 0.004 |
| VAZO ® 52 Initiator | 0.13 |
| Portion 3 | |
| Methyl ethyl ketone (MEK) | 10.13 |
| Portion 4 | |
| DMG Co (III) Catalyst | 0.004 |
| VAZO ® 52 Initiator | 1.43 |
| Methylethyl ketone | 52.09 |

-continued

| Parts by Weight | Grams |
|---|---|
| Portion 5 | |
| t-butyl methacrylate (tBMA) | 24.03 |
| Isobornyl methacrylate (IBOMA) | 72.10 |
| 2-Hydroxyethyl methacrylate (HEMA) | 24.03 |
| Total | 500.00 |

Portion 1 was heated to its reflux temperature in about 15 minutes. Portion 2 was thoroughly mixed and added as shot and the composition was held at its reflux temperature for 5 minutes. The vessel which contained Portion 2 was rinsed with Portion 3, which was then added to the reaction vessel along with Portion 2. Portions 4 and 5 were mixed and then added simultaneously to the reaction vessel while the vessel maintained its reflux temperature. For Portion 4, the first 54.8% was added over 90 minutes, and the remaining 45.2% was added over 240 minutes. For Portion 5, the first 67% was added over 120 minutes, and the remaining 33% was added over an additional 120 minutes. After Portions 4 and 5 were added to the vessel, the reaction was held at reflux for an additional 45 minutes. After the 45 minute hold, the reaction was cooled to room temperature.

The resulting macromonomer solution had a solids content of 50.3%, a $M_n$ of 5400 and a polydispersity of 2.02.

Example 2

(70) IBA//(30) IBOMA/tBMA/HEMA 60/20/20 Graft Copolymer

The macromonomer prepared in Example 1 was used in the following graft copolymer synthesis.

The following components were charged into a 1 liter flask equipped as in Example 1.

| Parts by Weight | Grams |
|---|---|
| Portion 1 | |
| Macromonomer (Example 1) | 181.57 |
| Isobornyl acrylate (IBA) | 39.03 |
| MEK | 54.76 |
| Portion 2 | |
| t-butyl peroxypivalate | 2.37 |
| MEK | 12.50 |
| Portion 3 | |
| IBA | 174.24 |
| Portion 4 | |
| t-butyl peroxypivalate | 2.37 |
| MEK | 23.69 |
| Portion 5 | |
| t-butyl peroxypivalate | 4.74 |
| MEK | 4.74 |
| Total | 500.00 |

Portion 1 was heated to reflux temperature over a period of approximately 20 minutes. Portion 2 was mixed and charged to the reactor in two equal portions—after the first was added, the reaction was held at reflux for 10 minutes before the second half was added. After the second half of Portion 2 was added, the reaction was held at reflux for 10 minutes. After the hold, Portions 3 and 4 were each added simultaneously to the reaction vessel while maintaining its contents at reflux. Portion 3 was added over 180 minutes, and Portion 4 was added over 240 minutes. After the additions of Portions 3 and 4 were completed, Portion 5 was thoroughly mixed and added to the reaction vessel over 15 minutes, maintaining the reflux temperature. After the addition of Portion 5 was completed, the reaction mixture was maintained at reflux for 120 minutes and then cooled to room temperature.

The resulting graft copolymer solution had a solids content of 68.64%, a $M_n$ of 8600 and a dispersity of 3.40.

Example 3

IBA/IBOMA/tBMA/HEMA 70/18/6/6 Random Copolymer

The following components were charged in a 1 liter flask equipped as in Example 1.

| Parts by Weight | Grams |
|---|---|
| Portion 1 | |
| IBOMA | 9.89 |
| tBMA | 3.30 |
| IBA | 38.46 |
| HEMA | 3.30 |
| MEK | 82.42 |
| Portion 2 | |
| IBA | 153.85 |
| IBOMA | 39.56 |
| tBMA | 13.19 |
| HEMA | 13.19 |
| Portion 3 | |
| Vazo ®52 Initiator | 5.49 |
| MEK | 137.36 |
| Total | 500.00 |

Portion 1 was heated to reflux temperature over a period of approximately 20 minutes. At reflux 10% of portion 3 was added to the reaction flask. After a 5 minute hold the remainder of portion 3 was added over 270 minutes while part 2 was being added over 240 minutes. At the end of both feeds the reaction mixture was held at reflux for an additional 30 minutes. The resulting random copolymer solution had a solids content of 59.82%, $M_n$ of 7700 and a dispersity of 2.60.

Example 4

(70)IBOMA//(30)IBOMA/tBMA/HEMA 60/20/20 Block Copolymer

The following components were charged to a 1 liter flask equipped as in Example 1.

| Parts by Weight | Grams |
|---|---|
| Portion 1 | |
| n-Butyl acetate | 141.31 |
| Macromonomer (Example 1) | 140.35 |
| Portion 2 | |
| IBOMA | 179.33 |
| Vazo ®67 Initiator | 0.85 |
| n-Butyl acetate | 35.33 |
| Portion 3 | |
| Vazo ®67 Initiator | 1.41 |
| n-Butyl acetate | 70.66 |
| Total | 500.00 |

Portion 1 was heated up to reflux and 69.24 gm. of MEK from the macromonomer was distilled out. When all the MED was distilled out and the reflux temperature was 95° C., portion 2 was added over 4 hours. When the addition of portion 2 was finished, portion 3 was added over 1 hour and then the reaction mixture was maintained at reflux for an additional 1 hour. The resulting block copolymer solution had a solid content of 52.8%, a $M_n$ of 15,000 and a dispersity of 2.01.

Example 5

IBOMA/tBMA/HEMA 39/41/20 Macromonomer

The macromonomer was prepared by charging the following components to a 1 liter flask equipped with a thermocouple, stirrer, dropping funnels, reflux condenser, and the means for bubbling nitrogen through the reaction.

| Parts by Weight | Grams |
|---|---|
| Portion 1 | |
| t-butyl methacrylate (tBMA) | 53.58 |
| Isobornyl methacrylate (IBOMA) | 50.34 |
| 2-Hydroxyethyl methacrylate (HEMA) | 25.98 |
| Methyl ethyl ketone (MEK) | 168.74 |
| Portion 2 | |
| Methylethyl ketone (MEK) | 17.41 |
| Isopropyl-bis(borondifluorodimethylglyoximato)cobaltate (III) Catalyst (DMG Co(III)) | 0.004 |
| VAZO ®52 Initiator | 0.13 |
| Portion 3 | |
| Methyl ethyl ketone (MEK) | 10.13 |
| Portion 4 | |
| DMG Co (III) Catalyst | 0.004 |
| VAZO ®52 Initiator | 1.43 |
| Methylethyl ketone | 52.09 |
| Portion 5 | |
| t-butyl methacrylate (tBMA) | 49.56 |
| Isobornyl methacrylate (IBOMA) | 46.56 |
| 2-Hydroxyethyl methacrylate (HEMA) | 24.03 |
| Total | 500.00 |

Portion 1 was heated to its reflux temperature in about 15 minutes. Portion 2 was thoroughly mixed and added as shot and the composition was held at its reflux temperature for 5 minutes. The vessel which contained Portion 2 was rinsed with Portion 3, which was then added to the reaction vessel along with Portion 2. Portions 4 and 5 were mixed and then added simultaneously to the reactive vessel while the vessel maintained its reflux temperature. For Portion 4, the first 54.8% was added over 90 minutes, and the remaining 45.2% was added over 240 minutes. For Portion 5, the first 67% was added over 120 minutes, and the remaining 33% was added over an additional 120 minutes. After Portions 4 and 5 were added to the vessel, the reaction was held at reflux for an additional 45 minutes. After the 45 minute hold, the reaction was cooled to room temperature.

The resulting macromonomer solution had a solid content of 50.0%, a $M_n$ of 9000 and a polydispersity of 2.05.

Example 6

(70)IBA//(30)IBOMA/tBMA/HEMA 39/41/20 Graft Copolymer

The macromonomer prepared in Example 5 was used in the following graft co-polymer synthesis. The following components were charged into a 1 liter flask equipped as in Example 1.

| Parts by Weight | Grams |
|---|---|
| Portion 1 | |
| Macromonomer (Example 5) | 181.57 |
| Isobornyl acrylate (IBA) | 39.03 |
| MEK | 54.76 |
| Portion 2 | |
| t-butyl peroxypivalate | 2.37 |
| MEK | 12.50 |
| Portion 3 | |
| IBA | 174.24 |
| Portion 4 | |
| t-butyl peroxypivalate | 2.37 |
| MEK | 23.69 |
| Portion 5 | |
| t-butyl peroxypivalate | 4.74 |
| MEK | 4.74 |
| Total | 500.00 |

Portion 1 was heated to reflux temperature over a period of approximately 20 minutes. Portion 2 was mixed and charged to the reactor in two equal portions—after the first was added, the reaction was held at reflux for 10 minutes before the second half was added. After the second half of Portion 2 was added, the reaction was held at reflux for 10 minutes. After the hold, Portions 3 and 4 were each added simultaneously to the reaction vessel while maintaining its contents at reflux. Portion 3 was added over 180 minutes, and Portion 4 was added over 240 minutes. After the additions of Portions 3 and 4 were completed, Portion 5 was thoroughly mixed and added to the reaction vessel over 15 minutes, maintaining the reflux temperature. After the addition of Portion 5 was completed, the reaction mixture was maintained at reflux for 120 minutes and then cooled to room temperature. The resulting graft copolymer solution had a solids content of 64.78%, a $M_w$ of 22,400 and a dispersity of 3.44.

Example 7

IBA/IBOMA/tBMA/HEMA 70/12/12/6 Random Composition

The following components were charged in a 1 liter flask equipped as in Example 1.

| Parts by Weight | Grams |
|---|---|
| Portion 1 | |
| IBOMA | 6.60 |
| tBMA | 6.60 |
| IBA | 38.46 |
| HEMA | 3.30 |
| MEK | 82.42 |
| Portion 2 | |
| IBA | 153.85 |
| IBOMA | 23.97 |
| tBMA | 23.97 |
| HEMA | 13.19 |
| Portion 3 | |
| Vazo ®52 Initiator | 5.49 |
| MEK | 137.36 |
| Total | 500.00 |

Portion 1 was heated to reflux temperature over a period of approximately 20 minutes. At reflux 10% of portion 3 was added to the reaction flask. After a 5 minute hold the remainder of portion 3 was added over 270 minutes while part 2 was being added over 240 minutes. At the end of both feeds the reaction mixture was held at reflux for an additional 30 minutes. The resulting random copolymer solution had a solids content of 55.6%, a $M_n$ of 9800 and a dispersity of 2.65.

Example 8

IBOMA/MEEMA 46/54 Macromonomer

The macromonomer was prepared by charging the following components to a 1 liter flask equipped with a thermocouple, stirrer, dropping funnels, reflux condenser, and the means for bubbling nitrogen through the reaction.

| Parts by Weight | Grams |
|---|---|
| Portion 1 | |
| Methoxyethoxyethyl methacrylate (MEEMA) | 70.17 |
| Isobornyl methacrylate (IBOMA) | 59.77 |
| Methyl ethyl ketone (MEK) | 168.79 |
| Portion 2 | |
| Methylethyl ketone (MEK) | 17.41 |
| Isopropyl-bis(borondifluorodimethylgloximate) cobalate (III) Catalyst (DMG Co(III)) | 0.004 |
| VAZO ®52 Initiator | 0.13 |
| Portion 3 | |
| Methyl ethyl ketone (MEK) | 10.13 |
| Portion 4 | |
| DMG Co (III) Catalyst | 0.004 |
| VAZO ®52 Initiator | 1.43 |
| Methylethyl ketone | 52.09 |
| Portion 5 | |
| MEEMA | 67.24 |
| Isobornyl methacrylate (IBOMA) | 52.82 |
| Total | 500.00 |

Portion 1 was heated to its reflux temperature in about 15 minutes. Portion 2 was thoroughly mixed and added as shot and the composition was held at its reflux temperature for 5 minutes. The vessel which contained Portion 2 was rinsed with Portion 3, which was then added to the reaction vessel along with Portion 2. Portions 4 and 5 were mixed and then added simultaneously to the reaction vessel while the vessel maintained its reflux temperature. For Portion 4, the first 54.8% was added over 90 minutes, and the remaining 45.2% was added over 240 minutes. For Portion 5, the first 67% was added over 120 minutes, and the remaining 33% was added over an additional 120 minutes. After Portions 4 and 5 were added to the vessel, the reaction was held at reflux for an additional 45 minutes. After the 45 minute hold, the reaction was cooled to room temperature.

The resulting macromonomer solution had a solids content of 50.3%, a $M_n$ of 2000 and a polydispersity of 1.77.

Example 9

(70)IBA//(30)IBOMA/MEEMA 46/54 Graft Copolymer

The macromonomer prepared in Example 8 was used in the following graft copolymer synthesis. The following components were charged into a 1 liter flask equipped as in Example 1.

| Parts by Weight | Grams |
| --- | --- |
| Portion 1 | |
| Macromonomer (Example 8) | 189.81 |
| Isobornyl acrylate (IBA) | 38.02 |
| MEK | 53.34 |
| Portion 2 | |
| t-butyl peroxypivalate | 2.31 |
| MEK | 12.17 |
| Portion 3 | |
| IBA | 169.73 |
| Portion 4 | |
| t-butyl peroxypivalate | 2.31 |
| MEK | 23.08 |
| Portion 5 | |
| t-butyl peroxypivalate | 4.61 |
| MEK | 4.61 |
| Total | 500.00 |

Portion 1 was heated to reflux temperature over a period of approximately 20 minutes. Portion 2 was mixed and charged to the reactor in two equal portions—after the first was added, the reaction was held at reflux for 10 minutes before the second half was added. After the second half of Portion 2 was added, the reaction was held at reflux for 10 minutes. After the hold, Portions 3 and 4 were each added simultaneously to the reaction vessel while maintaining its contents at reflux. Portion 3 was added over 180 minutes, and Portion 4 was added over 240 minutes. After the additions of Portions 3 and 4 were completed, Portion 5 was thoroughly mixed and added to the reaction vessel over 15 minutes, maintaining the reflux temperature. After the addition of Portion 5 was completed, the reaction mixture was maintained at reflux for 120 minutes and then cooled to room temperature. The resulting graft copolymer solution had a solids content of 64.93%, a $M_w$ of 18,700 and a dispersity of 3.16.

Example 10

IBOMA/tBMA/ITA 51/41/8 Macromonomer

The macromonomer was prepared by charging the following components to a 1 liter flask equipped with a thermocouple, stirrer, dropping funnels, reflux condenser, and the means for bubbling nitrogen through the reaction.

| Parts by Weight | Grams |
| --- | --- |
| Portion 1 | |
| t-butyl methacrylate (tBMA) | 51.73 |
| Isobornyl methacrylate (IBOMA) | 63.54 |
| Itaconic anhydride (ITA) | 9.87 |
| Methyl ethyl ketone (MEK) | 100.19 |
| Portion 2 | |
| Methylethyl ketone (MEK) | 16.80 |
| Isopropyl-bis(borondifluorodimethylglyoximato)cobaltate (III) Catalyst (DMG Co(III)) | 0.004 |
| VAZO ®52 Initiator | 0.13 |
| Portion 3 | |
| Methyl ethyl ketone (MEK) | 9.78 |
| Portion 4 | |
| DMG Co (III) Catalyst | 0.004 |
| VAZO ®52 Initiator | 1.38 |
| Methylethyl ketone | 52.28 |
| Portion 5 | |
| t-butyl methacrylate (tBMA) | 47.84 |
| Isobornyl methacrylate (IBOMA) | 58.89 |
| Itaconic anhydride (ITA) | 9.43 |
| MEK | 80.13 |
| Total | 500.00 |

Portion 1 was heated to its reflux temperature in about 15 minutes. Portion 2 was thoroughly mixed and added as shot and the composition was held at its reflux temperature for 5 minutes. The vessel which contained Portion 2 was rinsed with Portion 3, which was then added to the reaction vessel along with Portion 2. Portions 4 and 5 were mixed and then added simultaneously to the reaction vessel while the vessel maintained its reflux temperature. For Portion 4, the first 54.8% was added over 90 minutes, and the remaining 45.2% was added over 240 minutes. For Portion 5, the first 67% was added over 120 minutes, and the remaining 33% was added over an additional 120 minutes. After Portions 4 and 5 were added to the vessel, the reaction was held at reflux for an additional 45 minutes. After the 45 minute hold, the reaction was cooled to room temperature.

The resulting macromonomer solution had a solids content of 44.69%, a $M_n$ of 9400 and a polydispersity of 2.14.

Example 11

(70)IBA/(30)IBOMA/tBMA/ITA 51/41/8 Graft Copolymer

The macromonomer prepared in Example 10 was used in the following graft co-polymer synthesis. The following components were charged into a 1 liter flask equipped as in Example 1.

| Parts by Weight | Grams |
| --- | --- |
| Portion 1 | |
| Macromonomer (Example 10) | 185.73 |
| Isobornyl acrylate (IBA) | 38.52 |
| MEK | 54.04 |

-continued

| Parts by Weight | Grams |
|---|---|
| Portion 2 | |
| t-butyl peroxypivalate | 2.34 |
| MEK | 12.33 |
| Portion 3 | |
| IBA | 171.97 |
| Portion 4 | |
| t-butyl peroxypivalate | 2.34 |
| MEK | 23.38 |
| Portion 5 | |
| t-butyl peroxypivalate | 4.67 |
| MEK | 4.67 |
| Total | 500.00 |

Portion 1 was heated to reflux temperature over a period of approximately 20 minutes. Portion 2 was mixed and charged to the reactor in two equal portions—after the first was added, the reaction was held at reflux for 10 minutes before the second half was added. After the second half of Portion 2 was added, the reaction was held at reflux for 10 minutes. After the hold, Portions 3 and 4 were each added simultaneously to the reaction vessel while maintaining its contents at reflux. Portion 3 was added over 180 minutes, and Portion 4 was added over 240 minutes. After the additions of Portions 3 and 4 were completed, Portion 5 was thoroughly mixed and added to the reaction vessel over 15 minutes, maintaining the reflux temperature. After the addition of Portion 5 was completed, the reaction mixture was maintained at reflux for 120 minutes and then cooled to room temperature. The resulting graft copolymer solution had a solids content of 62.66%, a $M_w$ of 20,000 and a dispersity of 3.10.

Example 12

(70)IBA/(30)IBOMA/tBMA/ITA 51/41/8 Graft Copolymer in PGMEA 500 gm of graft copolymer prepared as in Example 11 was placed in a 1 liter flask equipped with a mechanical stirrer, a thermocouple, nitrogen bleed and a distillation column. 307 gm. of propylene glycol methyl ether acetate (PGMEA) were added to the flask and 193.6 gm of methyl ethyl ketone were distilled out. The resulting solution had a solids content of 57.21% solids.

Example 13

IBA/IBOMA/tBMA/ITA 70/15.3/12.3/2.4 Random Copolymer

The following components were charged in a 1 liter flask equipped as in Example 1.

| Parts by Weight | Grams |
|---|---|
| Portion 1 | |
| IBOMA | 7.57 |
| tBMA | 6.09 |
| IBA | 34.65 |

-continued

| Parts by Weight | Grams |
|---|---|
| ITA | 1.19 |
| MEK | 74.26 |
| Portion 2 | |
| IBA | 138.61 |
| IBOMA | 30.30 |
| tBMA | 24.36 |
| ITA | 4.75 |
| MEK | 74.26 |
| Portion 3 | |
| Vazo ®52 Initiator | 4.95 |
| MEK | 99.01 |
| Total | 500.00 |

Portion 1 was heated to reflux temperature over a period of approximately 20 minutes. At reflux 10% of portion 3 was added to the reaction flask. After a 5 minute hold the remainder of portion 3 was added over 270 minutes while part 2 was being added over 240 minutes. At the end of both feeds the reaction mixture was held at reflux for an additional 30 minutes. After the hold 247.5 gm of PGMEA were added to the flask and 255.5 gm of solvent was distilled out of the reaction mixture. The resulting random copolymer solution had a solids content of 58.29%, a $M_w$ of 14,900 and a dispersity of 2.37.

Example 14

IBOMA/tBMA/ITA/AMS 47/38.5/7.5/7 Macromonomer

The following components were charged in a 1 liter flask equipped as in Example 1.

| Parts by Weight | Grams |
|---|---|
| Portion 1 | |
| alpha methyl styrene dimer (AMSD) | 14.31 |
| PGMEA | 82.47 |
| Portion 2 | |
| tBMA | 78.51 |
| ITA | 15.23 |
| IBOMA | 96.60 |
| PGMEA | 82.47 |
| Portion 3 | |
| Vazo ®88 | 4.54 |
| PGMEA | 125.89 |
| Total | 500.00 |

Portion 1 was heated to reflux (130° C.) over 30 minutes. After 20 minutes of heating, 10% of part 2 and 2% of part 3 were added to the flask. When the contents of the flask reached 130° C., the remainder of portions 2 and 3 were fed in the following manner; 30% of each over 1 hour, the next 40% over 150 minutes, and the remainder over an additional 150 minutes. After the feeds were all in, the reaction mixture was held at reflux for an additional 1 hour. The resulting macromonomer solution had a solids content of 34.36%, a $M_n$ of 2300 with a dispersity of 1.67.

Example 15

(70)IBA//(30)IBOMA/tBMA/ITA/AMS 47/38.5/7.5/7 Graft Copolymer

The macromonomer prepared in Example 14 was used in the following graft co-polymer synthesis. The following components were charged into a 1 liter flask equipped as in Example 1.

| Parts by Weight | Grams |
|---|---|
| Portion 1 | |
| Macromonomer (Example 14) | 203.43 |
| Isobornyl acrylate (IBA) | 36.35 |
| MEK | 51.00 |
| Portion 2 | |
| t-butyl peroxypivalate | 2.21 |
| MEK | 11.64 |
| Portion 3 | |
| IBA | 162.28 |
| Portion 4 | |
| t-butyl peroxypivalate | 2.21 |
| MEK | 22.06 |
| Portion 5 | |
| t-butyl peroxypivalate | 4.41 |
| MEK | 4.41 |
| Total | 500.00 |

Portion 1 was heated to reflux temperature over a period of approximately 20 minutes. Portion 2 was mixed and charged to the reactor in two equal portions—after the first was added, the reaction was held at reflux for 10 minutes before the second half was added. After the second half of Portion 2 was added, the reaction was held at reflux for 10 minutes. After the hold, Portions 3 and 4 were each added simultaneously to the reaction vessel while maintaining its contents at reflux. Portion 3 was added over 180 minutes, and Portion 4 was added over 240 minutes. After the additions of Portions 3 and 4 were completed, Portion 5 was thoroughly mixed and added to the reaction vessel over 15 minutes, maintaining the reflux temperature. After the addition of Portion 5 was completed, the reaction mixture was maintained at reflux for 120 minutes and then cooled to room temperature. The resulting graft copolymer solution had a solids content of 62.50%, a $M_w$ of 10,200 and a dispersity of 2.25.

Example 16

IBOMA/tBMA/ITA 56/41/3 Macromonomer

The macromonomer was prepared by charging the following components to a 1 liter flask equipped with a thermocouple, stirrer, dropping funnels, reflux condenser, and the means for bubbling nitrogen through the reaction.

| Parts by Weight | Grams |
|---|---|
| Portion 1 | |
| t-butyl methacrylate (tBMA) | 51.72 |
| Isobornyl methacrylate (IBOMA) | 69.81 |
| Itaconic anhydride (ITA) | 3.70 |
| Methyl ethyl ketone (MEK) | 100.19 |
| Portion 2 | |
| Methylethyl ketone (MEK) | 16.80 |
| Isopropyl-bis(borondifluorodimethylglyoximato) cobaltate (III) Catalyst (DMG Co(III)) | 0.004 |
| VAZO ®52 Initiator | 0.13 |
| Portion 3 | |
| Methyl ethyl ketone (MEK) | 9.78 |
| Portion 4 | |
| DMG Co (III) Catalyst | 0.004 |
| VAZO ®52 Initiator | 1.38 |
| Methylethyl ketone | 52.28 |
| Portion 5 | |
| t-butyl methacrylate (tBMA) | 47.84 |
| Isobornyl methacrylate (IBOMA) | 64.69 |
| Itaconic anhydride (ITA) | 3.54 |
| MEK | 80.13 |
| Total | 500.00 |

Portion 1 was heated to its reflux temperature in about 15 minutes. Portion 2 was thoroughly mixed and added as shot and the composition was held at its reflux temperature for 5 minutes. The vessel which contained Portion 2 was rinsed with Portion 3, which was then added to the reaction vessel along with Portion 2. Portions 4 and 5 were mixed and then added simultaneously to the reaction vessel while the vessel maintained its reflux temperature. For Portion 4, the first 54.8% was added over 90 minutes, and the remaining 45.2% was added over 240 minutes. For Portion 5, the first 67% was added over 120 minutes, and the remaining 33% was added over an additional 120 minutes. After Portions 4 and 5 were added to the vessel, the reaction was held at reflux for an additional 45 minutes. After the 45 minute hold, the reaction was cooled to room temperature.

The resulting macromonomer solution had a solids content of 46.78%, a $M_n$ of 10,800 and a polydispersity of 1.93.

Example 17

(70)ZONYL® TAN//(30)IBOMA/tBMA/ITA 56/41/3 Graft Copolymer

The macromonomer prepared in Example 16 was used in the following graft copolymer synthesis. The following components were charged into a 1 liter flask equipped as in Example 1.

| Parts by Weight | Grams |
|---|---|
| Portion 1 | |
| Macromonomer (Example 16) | 146.18 |
| Perfluoroalkyl acrylate (ZONYL ® TAN) | 30.32 |
| Methyl isobutyl ketone (MIBK) | 42.53 |
| Portion 2 | |
| t-butyl peroxypivalate | 0.14 |
| Vazo ®88 | 1.84 |
| MIBK | 9.71 |
| Portion 3 | |
| ZONYL ® TAN | 135.35 |
| MIBK | 106.33 |
| Portion 4 | |
| Vazo ®88 | 1.84 |
| MIBK | 18.40 |

-continued

| Parts by Weight | Grams |
|---|---|
| Portion 5 | |
| Vazo ®88 | 3.68 |
| MIBK | 8.97 |
| Total | 500.00 |

Portion 1 was heated to reflux temperature over a period of approximately 20 minutes. Portion 2 was mixed and charged to the reactor in two equal portions—after the first was added, the reaction was held at reflux for 10 minutes before the second half was added. After the second half of Portion 2 was added, the reaction was held at reflux for 10 minutes. After the hold, Portions 3 and 4 were each added simultaneously to the reaction vessel while maintaining its contents at reflux. Portion 3 was added over 180 minutes, and Portion 4 was added over 240 minutes. After the additions of Portions 3 and 4 were completed, Portion 5 was thoroughly mixed and added to the reaction vessel over 15 minutes, maintaining the reflux temperature. After the addition of Portion 5 was completed, the reaction mixture was maintained at reflux for 120 minutes and then cooled to room temperature. The resulting graft copolymer solution had a solids content of 48.73%, a $M_w$ of 24,800 and a dispersity of 1.71.

Example 18

ZONYL® TAN/IBOMA/tBMA/ITA 70/16.8/12.3/1 Random Copolymer

The following components were charged in a 1 liter flask equipped as in Example 1.

| Parts by Weight | Grams |
|---|---|
| Portion 1 | |
| IBOMA | 7.09 |
| tBMA | 5.19 |
| ZONYL ® TAN | 29.49 |
| ITA | 0.42 |
| MIBK | 63.29 |
| Portion 2 | |
| ZONYL ® TAN | 117.97 |
| IBOMA | 28.35 |
| tBMA | 20.76 |
| ITA | 1.69 |
| MIBK | 158.23 |
| Portion 3 | |
| Vazo ®88 Initiator | 4.22 |
| MIBK | 63.29 |
| Portion 4 | |
| Vazo ®88 Initiator | 1.0 |
| MIBK | 8.0 |
| Total | 509.00 |

Portion 1 was heated to reflux temperature over a period of approximately 20 minutes. At reflux 10% of portion 3 was added to the reaction flask. After a 5 minute hold the remainder of portion 3 was added over 270 minutes while part 2 was being added over 240 minutes. At the end of feed 3, feed 4 was added over 30 minutes and then the reaction mixture was held at reflux for an additional 30 minutes. The resulting random copolymer solution had a solids content of 40.69%, a $M_w$ of 18,000 and a dispersity of 1.57.

Example 19

(70)IBA/STY 75/25//(30)IBOMA/tBMA/ITA 51/41/ 8 Graft Copolymer

The macromonomer prepared in Example 10 was used in the following graft copolymer synthesis. The following components were charged into a 1 liter flask equipped as in Example 1.

| Parts by Weight | Grams |
|---|---|
| Portion 1 | |
| Macromonomer (Example 10) | 185.74 |
| Isobornyl acrylate (IBA) | 28.89 |
| Styrene (STY) | 9.63 |
| MEK | 54.04 |
| Portion 2 | |
| t-butyl peroxypivalate | 2.00 |
| MEK | 12.33 |
| Portion 3 | |
| IBA | 128.97 |
| STY | 42.99 |
| Portion 4 | |
| t-butyl peroxypivalate | 2.00 |
| MEK | 23.38 |
| Portion 5 | |
| t-butyl peroxypivalate | 4.00 |
| MEK | 4.67 |
| Total | 500.00 |

Portion 1 was heated to reflux temperature over a period of approximately 20 minutes. Portion 2 was mixed and charged to the reactor in two equal portions—after the first was added, the reaction was held at reflux for 10 minutes before the second half was added. After the second half of Portion 2 was added, the reaction was held at reflux for 10 minutes. After the hold, Portions 3 and 4 were each added simultaneously to the reaction vessel while maintaining its contents at reflux. Portion 3 was added over 180 minutes, and Portion 4 was added over 240 minutes. After the additions of Portions 3 and 4 were completed, Portion 5 was thoroughly mixed and added to the reaction vessel over 15 minutes, maintaining the reflux temperature. After the addition of Portion 5 was completed, the reaction mixture was maintained at reflux for 120 minutes and then cooled to room temperature. The resulting graft copolymer solution had a solids content of 60.07%, a $M_w$ of 31,500 and a dispersity of 2.80.

Example 20

IBA/STY/IBOMA/tBMA/ITA 52.5/17.5/15.3/12.3/ 2.4 Random Copolymer

The following components were charged in a 1 liter flask equipped as in Example 1.

| Parts by Weight | Grams |
|---|---|
| Portion 1 | |
| IBOMA | 7.57 |
| tBMA | 6.09 |
| IBA | 25.99 |
| STY | 8,66 |
| ITA | 1.19 |
| MEK | 74.26 |
| Portion 2 | |
| IBA | 103.96 |
| STY | 34.65 |
| IBOMA | 30.30 |
| tBMA | 24.36 |
| ITA | 4.75 |
| MEK | 74.26 |
| Portion 3 | |
| Vazo ®52 Initiator | 4.95 |
| MEK | 99.01 |
| Total | 500.00 |

Portion 1 was heated to reflux temperature over a period of approximately 20 minutes. At reflux 10% of portion 3 was added to the reaction flask. After a 5 minute hold the remainder of portion 3 was added over 270 minutes while part 2 was being added over 240 minutes. At the end of both feeds the reaction mixture was held at reflux for an additional 30 minutes. After the hold 247.5 grams of PGMEA were added to the flask and 255.5 grams of solvent was distilled out of the reaction mixture. The resulting random copolymer solution had a solids content of 57.21%, a $M_w$ of 12,300 and a dispersity of 2.34.

Example 21

A photoresist composition was made at 29.6% solids as summarized below:

| Component | Wt. (gm) |
|---|---|
| Graft Copolymer Solution (Example 11) <br> (70) IBA/(30) IBOMA/tBMA/ITA 51/41/8 <br> that was additionally dried to 86.2% <br> solids by rotary evaporation | 9.8 |
| Propylene glycol methyl ether acetate (PGMEA) | 20.2 |
| Diaryl iodonium hexafluoroantimonate salt: <br> 4-(2-hydroxyl-1-tetradecyloxyphenyl) phenyl iodonium <br> hexafluoroantimonate [Sartomer SarCat ™ CD-1012 solid | 0.6 |

This solution was magnetically stirred overnight. Spin coating was done using a Brewer Science Inc. Model-100CB combination spin coater/hotplate on a 6 in. diameter silicon wafer, Type "P", 1.00 orient. Development was performed on a Litho Tech Japan, Resist Development Analyzer (RDA-790).

The wafer was prepared by depositing 6.0 ml of hexamethyldisilazane (HMDS) primer and spinning at 1000 rpm for 5 sec. Then 6.0 ml of the above solution was deposited and spun at 4500 rpm for 60 sec. and baked at 90° C. for 60 sec. The coating was exposed to broadband UV light (200 to 450 nm) with an ORIEL Model-82421 Solar Simulator 1000 watt for 40 sec. through a UV photomask on quartz that is effective in blocking UV light in masked portions throughout the UV. The exposed wafer was baked at 90° C. for 90 sec., and then developed for 20 sec. in tetramethyl ammonium hydroxide (TMAH) solution (ONKA NMD-3, 2.38% aqueous TMAH) to give a positive image.

Example 22

A photoresist composition was made at 26% solids as summarized below:

| Component | Wt. (gm) |
|---|---|
| Graft Copolymer Solution (Example 12) <br> (70) IBA/(30) IBOMA/tBMA/ITA 51/41/8 | 13.1 |
| Propylene glycol methyl ether acetate (PGMEA) | 16.9 |
| Diaryl iodonium hexafluoroantimonate salt: <br> 4-(2-hydroxyl-1-tetradecyloxyphenyl) phenyl iodonium <br> hexafluoroantimonate [Sartomer SarCat ™ CD-1012 solid] | 0.59 |

This solution was magnetically stirred overnight. Spin coating was done using a Brewer Science Inc. Model-100CB combination spin coater/hotplate on a 6 in. diameter silicon wafer, Type "P", 1.00 orient. Development was performed on a Litho Tech Japan co. Resist Development Analyzer (Model-790).

The wafer was prepared by depositing 6.0 ml of hexamethyldisilazane (HMDS) primer and spinning at 1000 rpm for 5 sec. Then 6.0 ml of the above solution was deposited and spun at 4500 rpm for 60 sec. and baked at 90° C. for 60 sec. The coating was exposed to broadband UV light (200 to 450 nm) with an ORIEL Model-82421 Solar Simulator 1000 watt. Exposure time was 20 sec. through a mask with 18 positions of varying neutral optical density to allow various exposure doses. The exposed wafer was baked at 90° C. for 90 sec., and then developed in tetramethylammonium hydroxide (TMAH) solution (ONKA NMD-3, 2.38% TMAH solution) to give a positive image.

The resist coating was of good quality, and developed cleanly in 20 sec.

Example 23

A photoresist composition was made at 26% solids as in Example 22, except that 12.9 gm of a solution of the random copolymer of Example 13, with the same overall composition of the graft copolymer of Example 12, was used in place of the graft copolymer solution of Example 12, and 17.1 gm of PGMEA was used. The photoresist was processed as in Example 22 to give a positive image. The resist coating quality was good. However, compared to the resist sample in Example 22, the resist developed more slowly (60 sec vs. 20 sec) and line edge quality was more ragged.

Example 24

A photoresist composition was made at 26% solids as in Example 22, except that 12.0 gm of a solution of the graft copolymer of Example 15 was used in place of the graph copolymer solution of Example 12, and 18.0 gm of PGMEA was used. The photoresist was processed as in Example 22 to give a positive image. The resist coating was of good quality, and developed cleanly in 20 sec although line edge quality was not as good as in Example 22.

Example 25

A photoresist composition was made at 26% solids as in Example 22, except that 15.4 gm of a solution of the graft copolymer of Example 17 was used in place of the graft copolymer solution of Example 12, and 14.6 gm of PGMEA was used. The photoresist was processed as in Example 22 to give a positive image. Resist coating quality was cloudy and nonuniform, but it did develop in 60 sec., and better than the corresponding random polymer in Example 26.

Example 26

A photoresist composition was made at 26% solids as in Example 22, except that 18.4 gm of a solution of the random copolymer of Example 18, which has the same overall composition of the graft copolymer of Example 17, was used in place of the graft copolymer solution of Example 12, and 11.6 gm of PGMEA was used. The photoresist was processed as in Example 22 to give a positive image. Resist coating quality was much poorer, and imaging/development was significantly poorer, than the graft copolymer in Example 25.

Example 27

A photoresist composition was made at 26% solids as in Example 22, except that 11.6 gm of a solution of the graft copolymer of Example 6 was used in place of the graft copolymer solution of Example 12, and 18.4 gm of PGMEA and 0.38 gm of CD-1012 were used. The photoresist was processed as in Example 22 to give a positive image. The resist took longer to expose and develop than the resist in Example 22, and did not give as good an image or clean development.

Example 28

A photoresist composition was made at 26% solids as in Example 22, except that 11.6 gm of a solution of the graft copolymer of Example 9 was used in place of the graft copolymer solution of Example 12, 18.4 gm of PGMEA and 0.38 gm of CD-1012 were used. The photoresist was processed as in Example 22 to give a positive image, with the exceptions that spin speed was 5500 rpm, exposure time was 180 sec, and time in the developer was 300 sec. The resist took longer to expose (180 sec) and develop (125 sec) than the resist of Example 22, but did develop cleanly and gave a very smooth coating.

Example 29

Measurement of Optical Transparency at 248 and 193 nm

Films of the random copolymer from Example 3 and the graft copolymer from Example 2 with the same composition, and the block copolymer from Example 4 with similar composition, were spin coated from solutions of these polymers, diluted to 20–30% solids with PGMEA, onto quartz substrates (1.5"×1.0"×0.09" thick; polished on both sides) with no HMDS primer at 4000 rpm for 60 sec, and were dried at 100° C. for 60 sec. on a static hot plate. Dry thickness were measured by a Sloan Dektak II instrument to be about 2.6 $\mu$. Absorption was measured on a Perkin-Elmer UV-Vis Lambda 9 spectrophotometer. Absorbance values ($\infty$m-1) are plotted versus wavelength in FIG. 1. This plot shows the low absorbance at 193 nm of the graft copolymer relative to the random polymer of same overall composition, and relative to the block copolymer of similar composition. Absorbance at 248 nm is negligible for all three polymers.

Example 30

Two graft copolymers, and the corresponding random copolymers with the same overall composition, are prepared. Thus, graft copolymer 30-A, (67) IBA//(33)IBOMA/tBMA 64/36, is prepared in a manner similar to Example 2 with the appropriate macromonomer, and the random copolymer 30-B, 67/21/12 IBA/IBOMA/tBMA, is prepared in a manner similar to Example 3. Likewise, graft copolymer 30-C, (68) IBA//(32)IBMOA/tMBA/ITA 72/19/9, is prepared in a manner similar to Example 12 with the appropriate macromoner, and the random copolymer 30-D, 68/23/6/3 IBA/IBOMA/tBMA/ITA, is prepared in a manner similar to Example 13. Photoresist compositions are prepared as in Examples 22 and 23, using 7.5 gm of each polymer (dry weight basis), 22.5 gm PGMEA, and 0.59 gm SarCat™ CD-1012. The formulations are processed as in Example 22, providing positive images, although the graft copolymers develop significantly faster than the respective random copolymers having the same overall composition, as indicated: 30-A vs. 30-B (60 sec vs. 78 sec), and 30-C vs. 30-D (25 sec vs. 150 sec).

Example 31

Measurement of Plasma Etch Rates

Polymer samples were dissolved in PGMEA to 20–30 weight % solids, and spin coated at 3000 rpm for 1 min. onto silicon wafers, and the coated wafer was then baked on a hot plate for 50 sec at 90° C. The plasma etch resistance of the spin coated polymers was then evaluated by exposure to a $CF_4/O_2$ plasma (pressure=150 mtorr, $CF_4/O_2$=40/7.1 sccm, source power=300 w, 483v DC Bias). The plasma etch rate was determined by protecting a portion of the coated wafer with a microscope slide or cover slip; the wafer was then exposed to the $CF_4/O_2$ plasma for a given length of time and the thickness change of the unprotected resist vs. resist protected under the glass slide was measured using an Alpha-Steo 200 Stylus Profilometer with a 5 $\mu$ tip stylus. The etch rate (in angstroms/minute) was usually measured at two different exposure times (e.g., 1.5 min. and 3.0 min.). For comparison purposes, results obtained for a commercial novolak resin (Borden Inc.) at two different exposure times are included, and the values obtained on a given day were used to give the relative etch rate data for other polymers measured on the same day. When several data exist, the etch rates and relative etch rates are average values.

| Copolymer (Example #) | Weight % of Spin Coating Solution | Exposure Time in $CF_4/O_2$ Plasma (min) | Etch Rate (Å/min) | Etch Rate Relative to Novolak |
|---|---|---|---|---|
| Borden Novolak PD-124C | 27 (in 55/45 PGMEA/acetone) | 3.0 | 1291 | — |
| | | 1.5 | 1371 | — |
| 11 | 25 | 3.0 | 1904 | 1.5 |
| | | 1.5 | 1384 | 1.2 |
| 6 | 25 | 3.0 | 1516 | 1.2 |
| | | 1.5 | 1615 | 1.4 |
| 9 | 25 | 3.0 | 1487 | 1.2 |
| | | 1.5 | 1549 | 1.3 |
| 3 | 25 | 3.0 | 1750 | 1.4 |
| | | 1.5 | 1476 | 0.9 |
| 2 | 25 | 3.0 | 1945 | 1.5 |
| | | 1.5 | 1618 | 1.2 |
| 4 | 25 | 3.0 | 1875 | 1.6 |
| | | 1.5 | 1667 | 1.1 |
| 33 | 25 | 3.0 | 1719 | 1.4 |
| | | 1.5 | 1716 | 1.5 |

Example 32

A photoresist composition was made at 27% solids as in Example 22, except that 16.0 gm of a solution of the graft copolymer solution of Example 34 was used in place of the graft copolymer solution of Example 12, and 14.0 gm of PGMEA and 0.00 gm of CD-1012 were used. The photoresist was processed as in Example 22 to give a positive image. Image quality and development were at least as good as those for Example 22.

Example 33

A photoacid generator (PAG) was attached to the arm of a graft copolymer in the following way. To a 500 ml three necked flask fitted with a reflux condenser and nitrogen bubbler, glass bladed Teflon® paddle stirrer, stainless steel thermocouple, heating mantle, and serum cap, was charged 137.2 gm graft copolymer solution of Example 11 and 35 ml methylethyl ketone (MEK), and the resulting mixture was stirred. To this was added with stirring 6.61 gm of 4-(2-hydroxy-1-tetradecyl-1-oxy)phenyl phenyl iodonium hexafluoroantimonate [Sartomer SarCat™ CD-1012 solid] which was rinsed with 26 ml of MEK. The solution was heated to about 57° C. and held about four hours with stirring until the anhydride level was judged to be constant by periodically reacting small samples with an excess of n-butyl amine, and titrating the excess with 0.1 M aqueous $HClO_4$. This provided 154.8 gm of solution product measuring 50.29% Solids.

Example 34

A photoresist composition was made at 28% solids as in Example 22, except that 12.8 gm of a solution of the graft copolymer of Example 11 was used in place of the graft copolymer solution of Example 12, 17.2 gm of PGMEA and 0.60 gm of CD-1012 were used. The photoresist was processed as in Example 22 to give a positive image.

Example 35

IBMOA/tBMA 60/40 Macromonomer

The macromonomer is prepared by charging the following components to a 1 liter flask equipped with a thermocouple, stirrer, dropping funnels, reflux condenser, and the means for bubbling nitrogen through the reaction.

| Parts by Weight | Grams |
| --- | --- |
| Portion 1 | |
| t-butyl methacrylate (tBMA) | 51.96 |
| Isobornyl methacrylate (IBOMA) | 77.94 |
| Methyl ethyl ketone (MEK) | 168.74 |
| Portion 2 | |
| Methylethyl ketone(MEK) | 17.41 |
| Isopropyl-bis(borondifluorodimethylglyoximato) cobaltate (III) Catalyst (DMG Co(III)) | 0.004 |
| VAZO ®52 Initiator | 0.13 |
| Portion 3 | |
| Methyl ethyl ketone (MEK) | 10.13 |
| Portion 4 | |
| DMG Co (III) Catalyst | 0.004 |
| VAZO ®52 Initiator | 1.43 |
| Methylethyl ketone | 52.09 |
| Portion 5 | |
| t-butyl methacrylate (tBMA) | 48.06 |
| Isobornyl methacrylate (IBOMA) | 72.10 |
| Total | 500.00 |

Portion 1 is heated to its reflux temperature in about 15 minutes. Portion 2 is thoroughly mixed and is added as short and the composition is held at its reflux temperature for 5 minutes. The vessel which contained Portion 2 is rinsed with Portion 3, which is then added to the reaction vessel along with Portion 2. Portions 4 and 5 are mixed and then added simultaneously to the reaction vessel while the vessel is maintained its reflux temperature. For Portion 4, the first 54.8% is added over 90 minutes, and the remaining 45.2% is added over 240 minutes. For Portion 5, the first 67% is added over 120 minutes, and the remaining 33% is added over an additional 120 minutes. After Portions 4 and .54 are added to the vessel, the reaction is held at reflux for an additional 45 minutes. After the 45 minute hold, the reaction is cooled to room temperature.

The resulting macromonomer solution has a solids content of approximately 49%, a $M_n$ of approximately 5700, and a polydispersity of approximately 2.

Example 36

(70)BA//(30)IBOMA/tBMA 60/40 Graft Copolymer

The macromonomer prepared in Example 35 is used in the following graft copolymer synthesis. The following components are charged into a 1 liter flask equipped as in Example 1.

| Parts by Weight | Grams |
| --- | --- |
| Portion 1 | |
| Macromonomer (Example 35) | 203.43 |
| Isobornyl acrylate (IBA) | 36.35 |
| MEK | 51.00 |
| Portion 2 | |
| t-butyl peroxypivalate | 2.21 |
| MEK | 11.64 |
| Portion 3 | |
| IBA | 162.28 |
| Portion 4 | |
| t-butyl peroxypivalate | 2.21 |
| MEK | 22.06 |
| Portion 5 | |
| t-butyl peroxypivalate | 4.41 |
| MEK | 4.41 |
| Total | 500.00 |

Portion 1 is heated to reflux temperature over a period of approximately 20 minutes. Portion 2 is mixed and charged to the reaction in two equal portions—after the first is added, the reaction is held at reflux for 10 minutes before the second half is added. After the second half of Portion 2 is added, the reaction is held at reflux for 10 minutes. After the hold, Portions 3 and 4 are each added simultaneously to the reaction vessel while maintaining its contents at reflux. Portion 3 is added over 180 minutes, and Portion 4 is added over 240 minutes. After the additions of Portions 3 and 4 are completed, Portion 5 is thoroughly mixed and added to the reaction vessel over 15 minutes, maintaining the reflux temperature. After the addition of Portion 5 is completed, the reaction mixture is maintained at reflux for 120 minutes and then cooled to room temperature. The resulting graft copolymer solution has a solids content of approximately 60%, a $M_w$ of approximately 16,000 and a dispersity of approximately 2.4.

Example 37

IBA/tBMA/HEMA 85.4/7.3/7.3 Random Copolymer

The following components were charged in a 1 liter flask equipped as in Example 1.

| Parts by Weight | Grams |
|---|---|
| Portion 1 | |
| tBMA | 2.41 |
| IBA | 28.17 |
| HEMA | 2.41 |
| MEK | 49.42 |
| Portion 2 | |
| IBA | 112.69 |
| tBMA | 9.62 |
| HEMA | 9.62 |
| Portion 3 | |
| Vazo ®52 Initiator | 3.29 |
| MEK | 82.37 |
| Total | 300.00 |

Portion 1 was heated to reflux temperature over a period of approximately 20 minutes. At reflux 10% of portion 3 was added to the reaction flask. After a 5 minute old the remainder of portion 3 was added over 270 minutes while part 2 was being added over 240 minutes. At the end of both feeds the reaction mixture was held at reflux for an additional 30 minutes. The resulting random copolymer solution has a solids content of 55.90%, a $M_w$ of 13,200 and a dispersity of 2.16.

Example 38

IBOMA/tBMA/HEMA 60/20/20 Random Copolymer

The following components were charged in a 1 liter flask equipped as in Example 1.

| Parts by Weight | Grams |
|---|---|
| Portion 1 | |
| tBMA | 6.59 |
| IBOMA | 28.17 |
| HEMA | 6.59 |
| MEK | 49.45 |
| Portion 2 | |
| IBOMA | 79.12 |
| tBMA | 26.37 |
| HEMA | 26.37 |
| Portion 3 | |
| Vazo ® 52 Initiator | 3.30 |
| MEK | 82.42 |
| Total | 300.00 |

Portion 1 was heated to reflux temperature over a period of approximately 20 minutes. At reflux 10% of portion 3 was added to the reaction flask. After a 5 minute hold the remainder of portion 3 was added over 270 minutes while part 2 was being added over 240 minutes. At the end of both feeds the reaction mixture was held at reflux for an additional 30 minutes. The resulting random copolymer solution had a solids content of 55.18%, a $M_w$ of 15,100 and a dispersity of 2.19.

Example 39

IBA/IBOMA/HEMA 74.5/19.1/6.4 Random Copolymer

The following components were charged in a 1 liter flask equipped as in Example 1.

| Parts by Weight | Grams |
|---|---|
| Portion 1 | |
| IBA | 24.56 |
| IBOMA | 6.3 |
| HEMA | 2.11 |
| MEK | 49.45 |
| Portion 2 | |
| IBOMA | 25.22 |
| IBA | 98.23 |
| HEMA | 8.44 |
| Portion 3 | |
| Vazo ®52 Initiator | 3.30 |
| MEK | 82.41 |
| Total | 300.00 |

Portion 1 was heated to reflux temperature over a period of approximately 20 minutes. At reflux 10% of portion 3 was added to the reaction flask. After a 5 minute hold the remainder of portion 3 was added over 270 minutes while part 2 was being added over 240 minutes. At the end of both feeds the reaction mixture was held at reflux for an additional 30 minutes. The resulting random copolymer solution had a solids content of 55.95%, a $M_w$ of 12,700 and a dispersity of 2.09.

Example 40

IBA/IBOMA/tBMA 76/18/6 Random Copolymer

The following components were charged in a 1 liter flask equipped as in Example 1.

| Parts by Weight | Grams |
|---|---|
| Portion 1 | |
| IBA | 41.76 |
| IBOMA | 9.89 |
| tBMA | 3.30 |
| MEK | 82.42 |
| Portion 2 | |
| IBOMA | 39.56 |
| IBA | 167.03 |
| tBMA | 13.19 |
| Portion 3 | 5.49 |
| MEK | 137.36 |
| Total | 500.00 |

Portion 1 was heated to reflux temperature over a period of approximately 20 minutes. At reflux 10% of portion 3 was added to the reaction flask. After a 5 minute hold the remainder of portion 3 was added over 270 minutes while part 2 was being added over 240 minutes. At the end of both feeds the reaction mixture was held at reflux for an additional 30 minutes. The resulting random copolymer solution had a solids content of 58.88%, a $M_w$ of 16,200 and a dispersity of 2.39.

Example 41

IBA Homopolymer

The following components were charged in a 1 liter flask equipped as in Example 1.

| Parts by Weight | Grams |
|---|---|
| Portion 1 | |
| IBA | 54.95 |
| MEK | 82.42 |
| Portion 2 | |
| IBA | 219.78 |
| Portion 3 | |
| Vazo ®52 Initiator | 5.49 |
| MEK | 137.36 |
| Total | 500.00 |

Portion 1 was heated to reflux temperature over a period of approximately 20 minutes. At reflux 10% of portion 3 was added to the reaction flask. After a 5 minute hold the remainder of portion 3 was added over 270 minutes while part 2 was being added over 240 minutes. At the end of both feeds the reaction mixture was held at reflux for an additional 30 minutes. The resulting random copolymer solution had a solids content of 53.60%, a $M_w$ of 13,700 and a dispersity of 2.15.

Example 42

A photoresist composition is made at 26% solids as in Example 22, except that 12.2 gm of a solution of the graft copolymer of Example 36 is used in place of the graft copolymer solution of Example 22, and 17.8 gm of PGMEA is used. The photoresist is processed as in Example 22 to give a positive image. The resist coating is of good quality, and develops cleanly.

Example 43

This example illustrates a photoresist of the invention that contains a dissolution inhibitor. A photoresist composition is made at 26% solids as in Example 22, except that the following are used: 10.5 gm of the graft copolymer solution of Example 12, 1.5 gm of tert-butyl lithocholate, and 18.0 gm of PGMEA. The photoresist is processed as in Example 22 to give a positive image. The resist coating is of good quality and develops cleanly.

Example 44

Effect of Monomer Composition on Optical Transparency in the EUV:

The random copolymers of Examples 37–41 were diluted and coated as in Example 29 to test the effect of monomer composition on optical transparency in the EUV (193 nm). Comparison of the spectra indicate that methacrylate monomers increase absorbance of the resulting more than do acrylate monomers. It is also indicated that these monomers types should be separated for reduced absorbance, such as in different segments of the graft copolymer, as demonstrated in Example 29 and FIG. 1.

Example 45A

MMA/tBMA/MAA 40/40/20 Macromonomer

The macromonomer was prepared by charging the following components to a 1 liter flask equipped with a thermocouple, stirrer, dropping funnels, reflux condenser, and the means for bubbling nitrogen through the reaction.

| Parts by Weight | Grams |
|---|---|
| Portion 1 | |
| t-butyl methacrylate (tBMA) | 184.21 |
| Methyl methacrylate (MMA) | 184.21 |
| Methacrylic acid (MAA) | 61.60 |
| Isopropanol (IPRAL) | 519.60 |
| Portion 2 | |
| Methylethyl ketone (MEK) | 16.08 |
| Isopropanol (IPRAL) | 37.52 |
| Isopropyl-bis(borondifluorodimethylglyoximato)cobaltate (III) Catalyst (DMG Co(III)) | 0.02 |
| VAZO ®52 Initiator | 0.40 |
| Portion 3 | |
| Isopropanol (IPRAL) | 31.20 |
| Portion 4 | |
| Methylethyl ketone (MEK) | 48.12 |
| DMG Co (III) Catalyst | 0.04 |
| VAZO ®52 Initiator | 4.40 |
| Isopropanol (IPRAL) | 112.28 |
| Portion 5 | |
| t-butyl methacrylate (tBMA) | 123.21 |
| Methyl methacrylate (MMA) | 123.21 |
| Methacrylic acid (MAA) | 92.40 |
| Total | 500.00 |

Portion 1 was heated to its reflux temperature in about 15 minutes. Portion 2 was thoroughly mixed and added as shot and the composition was held at its reflux temperature for 5 minutes. The vessel which contained Portion 2 was rinsed with Portion 3, which was then added to the reaction vessel along with Portion 2. Portions 4 and 5 were mixed and then added simultaneously to the reaction vessel while the vessel maintained its reflux temperature. For Portion 4, the first 54.8% was added over 90 minutes, and the remaining 45.2% was added over 240 minutes. For Portion 5, the first 67% was added over 120 minutes, and the remaining 33% was added over an additional 120 minutes. After Portions 4 and 5 were added to the vessel, the reaction was held at reflux for an additional 45 minutes. After the 45 minute hold, the reaction was cooled to room temperature.

The resulting macromonomer solution has a solids content of 50.33%, a $M_n$ of 3181 and a polydispersity of 1.98.

Example 45B (70)IBA/MA/AA/tBA 70/10/10/10//(30)MMA/ tBMA/MAA 40/40/20 Graft Copolymer The macromonomer prepared in Example 45A was used in the following graft co-polymer synthesis. The following components were charged into a 1 liter flask equipped as in Example 1.

| Parts by Weight | Grams |
|---|---|
| Portion 1 | |
| Macromonomer (Example 45A) | 169.56 |
| Isobornyl acrylate (IBA) | 25.52 |
| Methyl acrylate (MA) | 3.65 |
| Acrylic acid (AA) | 3.65 |
| t-Butyl acrylate (tBA) | 3.65 |
| MEK | 84.23 |
| Portion 2 | |
| t-butyl peroxypivalate | 2.21 |
| MEK | 11.67 |
| Portion 3 | |
| Isobornyl acrylate (IBA) | 113.89 |
| Methyl acrylate (MA) | 16.27 |
| Acrylic acid (AA) | 16.27 |
| t-Butyl acrylate (tBA) | 16.27 |
| Portion 4 | |
| t-butyl peroxypivalate | 2.21 |
| MEK | 22.12 |
| Portion 5 | |
| t-butyl peroxypivalate | 4.42 |
| MEK | 4.42 |
| Total | 500.00 |

Portion 1 was heated to reflux temperature over a period of approximately 20 minutes. Portion 2 was mixed and charged to the reactor in two equal portions—after the first was added, the reaction was held at reflux for 10 minutes before the second half was added. After the second half of Portion 2 was added, the reaction was held at reflux for 10 minutes. After the hold, Portions 3 and 4 were each added simultaneously to the reaction vessel while maintaining its contents at reflux. Portion 3 was added over 180 minutes, and Portion 4 was added over 180 minutes. After the additions of Portions 3 and 4 were completed, hold at reflux for 60 minutes. Then Portion 5 was thoroughly mixed and added to the reaction vessel over 30 minutes, maintaining the reflux temperature. After the addition of Portion 5 was completed, the reaction mixture was maintained at reflux for 60 minutes and then cooled to room temperature. The resulting graft copolymer solution had a solids content of 60.3%, a $M_w$ of 11607 and a polydispersity of 2.35.

Example 46

(70)IBA/AA 85/15//(30)MMA/tBMA/MAA 40/40/ 20 Graft Copolymer

The macromonomer prepared in Example 45A was used in the following graft co-polymer synthesis. The following components were charged into a 1 liter flask equipped as in Example 1.

| Parts by Weight | Grams |
|---|---|
| Portion 1 | |
| Macromonomer (Example 45A) | 169.56 |
| Isobornyl acrylate (IBA) | 30.98 |
| Acrylic acid (AA) | 5.47 |
| MEK | 84.23 |
| Portion 2 | |
| t-butyl peroxypivalate | 2.21 |
| MEK | 11.67 |
| Portion 3 | |
| Isobornyl acrylate (IBA) | 138.30 |
| Acrylic acid (AA) | 24.41 |
| Portion 4 | |
| t-butyl peroxypivalate | 2.21 |
| MEK | 22.12 |
| Portion 5 | |
| t-butyl peroxypivalate | 4.42 |
| MEK | 4.42 |
| Total | 500.00 |

Portion 1 was heated to reflux temperature over a period of approximately 20 minutes. Portion 2 was mixed and charged to the reactor in two equal portions—after the first was added, the reaction was held at reflux for 10 minutes before the second half was added. After the second half of Portion 2 was added, the reaction was held at reflux for 10 minutes. After the hold, Portions 3 and 4 were each added simultaneously to the reaction vessel while maintaining its contents at reflux. Portion 3 was added over 180 minutes, and Portion 4 was added over 180 minutes. After the additions of Portions 3 and 4 were completed, hold at reflux for 60 minutes. Then Portion 5 was thoroughly mixed and added to the reaction vessel over 30 minutes, maintaining the reflux temperature. After the addition of Portion 5 was completed, the reaction mixture was maintained at reflux for 60 minutes and then cooled to room temperature. The resulting graft copolymer solution had a solids content of 60.7%, a $M_w$ of 10350 and a polydispersity of 2.78.

Example 47

(70)IBA/MA/AA 80/10/10//(30)MMA/tBMA/MAA 40/40/20 Graft Copolymer

The macromonomer prepared in Example 45A was used in the following graft co-polymer synthesis. The following components were charged into a 1 liter flask equipped as in Example 1.

| Parts by Weight | Grams |
|---|---|
| Portion 1 | |
| Macromonomer (Example 45A) | 169.56 |
| Isobornyl acrylate (IBA) | 23.69 |
| Methyl acrylate (MA) | 3.64 |

-continued

| Parts by Weight | Grams |
|---|---|
| Acrylic acid (AA) | 3.64 |
| MEK | 84.23 |
| Portion 2 | |
| t-butyl peroxypivalate | 2.21 |
| MEK | 11.67 |
| Portion 3 | |
| Isobornyl acrylate (IBA) | 130.14 |
| Methyl acrylate (MA) | 16.27 |
| Acrylic acid (AA) | 16.27 |
| Portion 4 | |
| t-butyl peroxypivalate | 2.21 |
| MEK | 22.12 |
| Portion 5 | |
| t-butyl peroxypivalate | 4.42 |
| MEK | 4.42 |
| Total | 500.00 |

Portion 1 was heated to reflux temperature over a period of approximately 20 minutes. Portion 2 was mixed and charged to the reactor in two equal portions—after the first was added, the reaction was held at reflux for 10 minutes before the second half was added. After the second half of Portion 2 was added, the reaction was held at reflux for 10 minutes. After the held, Portions 3 and 4 were each added simultaneously to the reaction vessel while maintaining its contents at reflux. Portion 3 was added over 180 minutes, and Portion 4 was added over 180 minutes. After the additions of Portions 3 and 4 were completed, hold at reflux for 60 minutes. Then Portion 5 was thoroughly mixed and added to the reaction vessel over 30 minutes, maintaining the reflux temperature. After the addition of Portion 5 was completed, the reaction mixture was maintained at reflux for 60 minutes and then cooled to room temperature. The resulting graft copolymer solution has a solids content of 65.9%, a $M_w$ of 6246 and a polydispersity of 2.0.

Example 48

(70)IBA/AN/AA 65/20/15//(30)MMA/tBMA/MAA 40/40/20 Graft Copolymer

The macromonomer prepared in Example 45A was used in the following graft co-polymer synthesis. The following components ere charged into a 1 liter flask equipped as in Example 1.

| Parts by Weight | Grams |
|---|---|
| Portion 1 | |
| Macromonomer (Example 45A) | 169.56 |
| Isobornyl acrylate (IBA) | 23.69 |
| Acrylonitrile | 7.29 |
| Acrylic acid (AA) | 5.47 |
| MEK | 84.23 |
| Portion 2 | |
| t-butyl peroxypivalate | 2.21 |
| MEK | 11.67 |
| Portion 3 | |
| Isobornyl acrylate (IBA) | 105.76 |
| Acrylonitrile (AN) | 32.54 |
| Acrylic acid (AA) | 24.41 |
| Portion 4 | |
| t-butyl peroxypivalate | 2.21 |
| MEK | 22.12 |
| Portion 5 | |
| t-butyl peroxypivalate | 4.42 |
| MEK | 4.42 |
| Total | 500.00 |

Portion 1 was heated to reflux temperature over a period of approximately 20 minutes. Portion 2 was mixed and charged to the reactor in two equal portions—after the first was added, the reaction was held at reflux for 10 minutes before the second half was added. After the second half of Portion 2 was added, the reaction was held at reflux for 10 minutes. After the hold, Portions 3 and 4 were each added simultaneously to the reaction vessel while maintaining its contents at reflux. Portion 3 was added over 180 minutes, and Portion 4 was added over 180 minutes. After the additions of Portions 3 and 4 were completed, hold at reflux for 60 minutes. Then Portion 5 was thoroughly mixed and added to the reaction vessel over 30 minutes, maintaining the reflux temperature. After the addition of Portion 5 was completed, the reaction mixture was maintained at reflux for 60 minutes and then cooled to room temperature. To remove the residual acrylonitrile, the MEK was stripped at reflux temperature until the temperature was reached 83.9° C. Then 258 gm of PGMEA (propylene glycol monomethyl ether acetate) was added and the resulting solution was concentrated by using a rotavap. The resulting graft copolymer solution had a solids content of 61.0%, a $M_w$ of 16943 and a polydispersity of 2.55.

Example 49

(70)IBA//(30)MMA/tBMA/MAA 40/40/20 Graft Copolymer

The macromonomer prepared in Example 45A was used in the following graft co-polymer synthesis. The following components were charged into a 1 liter flask equipped as in Example 1.

| Parts by Weight | Grams |
|---|---|
| Portion 1 | |
| Macromonomer (Example 45A) | 169.56 |
| Isobornyl acrylate (IBA) | 36.45 |
| MEK | 84.23 |
| Portion 2 | |
| t-butyl peroxypivalate | 2.21 |
| MEK | 11.67 |
| Portion 3 | |
| Isobornyl acrylate (IBA) | 162.70 |

-continued

| Parts by Weight | Grams |
|---|---|
| Portion 4 | |
| t-butyl peroxypivalate | 2.21 |
| MEK | 22.12 |
| Portion 5 | |
| t-butyl peroxypivalate | 4.42 |
| MEK | 4.42 |
| Total | 500.00 |

Portion 1 was heated to reflux temperature over a period of approximately 20 minutes. Portion 2 was mixed and charged to the reactor in two equal portions—after the first was added, the reaction was held at reflux for 10 minutes before the second half was added. After the second half of Portion 2 was added, the reaction was held at reflux for 10 minutes. After the hold, Portions 3 and 4 were each added simultaneously to the reaction vessel while maintaining its contents at reflux. Portion 3 was added over 180 minutes, and Portion 4 was added over 180 minutes. After the additions of Portions 3 and 4 were completed, hold at reflux for 60 minutes. Then Portion 5 was thoroughly mixed and added to the reaction vessel over 30 minutes, maintaining the reflux temperature. After the addition of Portion 5 was completed, the reaction mixture was maintained at reflux for 60 minutes and then cooled to room temperature. The resulting graft copolymer solution had a solids content of 59.2%, a $M_w$ of 7562 and a polydispersity of 2.61.

Example 50

The following was prepared and magnetically stirred overnight.

| Component | Wt. (gm) |
|---|---|
| Copolymer described in Example 45, [70] IBA/MA/tBA/AA 70/10/10/10// [30] MMA/tBMA/MAA 40/40/20, which had been solvent exchanged with PGMEA as follows. Thus, to 100.0 gm of the copolymer solution in Example 45B (60.3% Solids in MEK) was added 140.7 gm PGMEA, and rotoary evaporated under vacuum to a net weight of 201.0 gm (30% Solids) | 7.3 |
| Propylene glycol methyl ether acetate (PGMEA) | 5.3 |
| Cyclohexanone | 7.5 |
| t-Butyl Lithocholate | 2.18 |
| 5% (wt) solution of triphenylsulfonium triflate dissolved in cyclohexanone which was filtered through a 0.45μ PTFE syringe filter. | 2.70 |

Spin coating of the above formulation was done using a Brewer Science Inc. Model-100CB combination spin coater/hotplate on a 4 in. diameter silicon wafer, Type "P", 1.00 orient. Development was performed on a Litho Tech Japan Co. Resist Development Analyzer (Model-790).

The wafer was prepared by depositing 4 ml of hexamethyldisilazane (HMDS) primer and spinning at 1000 rpm for 5 sec. and then 3500 rpm for 10 sec. Then 4 ml of the above formulation, after filtering through a 0.45 μ PTFE syringe filter, was deposited and spun at 3000 rpm for 60 seconds and baked at 120° C. for 60 seconds. The coated wafer was exposed to 248 nm light obtained by passing broadband UV light from an ORIEL Model-82421 Solar Simulator (1000 watt) through a 248 nm interference filter which passes about 30% of the energy at 248 nm. Exposure time was 5 seconds, providing a dose of 3.4 mJ/cm$^2$, through a mask with 18 positions of varying neutral optical density to allow various exposure doses. The exposed wafer was then baked at 120° C. for 120 seconds. The wafer was developed for 10 seconds in aqueous tetramethylammonium hydroxide (TMAH) solution (ONKA NMD-W, 2.38% TMAH solution) to give a positive image.

Example 51

The following formulation was prepared and magnetically stirred overnight.

| Component | Wt. (gm) |
|---|---|
| Copolymer described in Example 46, [70] IBA/AA 85/15 // [30] MMA/tBMA/MAA 40/40/20, which had been solvent exchanged with PGMEA as follows. Thus, to 50.0 gm of the copolymer solution in Example 46 (60.7% Solids in MEK) was added 19.7 gm PGMEA, and rotoary evaporated under vacuum to a net weight of 49.9 gm (60.8% Solids). | 5.3 |
| Propylene glycol methyl ether acetate (PGMEA) | 15.8 |
| t-Butyl Lithocholate | 1.13 |
| 5% (wt) solution of triphenylsulfonium triflate dissolved in cyclohexanone which was filtered through a 0.45μ PTFE syringe filter | 2.8 |

The above formulation was processed as in Example 50 to give a positive image.

Example 52

The following formulation was prepared and magnetically stirred overnight.

| Component | Wt. (gm) |
|---|---|
| Copolymer described in Example 47, [70] IBA/MA/AA 80/10/10 // [30] MMA/TBMA/MAA 40/40/20, which had been solvent exchanged with PGMEA as follows. Thus, to 100.0 gm of the copolymer solution in Example 47 (65.9% Solids in MEK) was added 153.8 gm PGMEA, and rotoary evaporated under vacuum to a net weight of 219.7 gm (30% Solids) | 7.3 |
| Propylene glycol methyl ether acetate (PGMEA) | 5.3 |
| Cyclohexanone | 7.5 |
| t-Butyl Lithocholate | 2.18 |
| 5% (wt) solution of triphenylsulfonium triflate dissolved in cyclohexanone which was filtered through a 0.45μ PTFE syringe filter | 2.70 |

The above formulation was processed as in Example 50, except that an exposure time of 30 seconds providing a dose of 20.4 mJ/cm$^2$ was used, to give a positive image.

Example 53

The following formulation was prepared and magnetically stirred overnight.

| Component | Wt. (gm) |
|---|---|
| Copolymer described in Example 48, [70] IBA/AN/AA 65/20/15 // [30] MMA/tBMA/MAA 40/40/20, which had been additionally solvent exchanged with PGMEA as follows. Thus, to 100.0 gm of the copolymer solution in Example 48 (61.0% Solids) was added 140.2 gm PGMEA, and rotoary evaporated under vacuum to a net weight of 200.3 gm (30.5% Solids) | 7.3 |
| Propylene glycol methyl ether acetate (PGMEA) | 5.3 |
| Cyclohexanone | 12.5 |
| t-Butyl Lithocholate | 2.18 |
| 5% (wt) solution of triphenylsulfonium triflate dissolved in cyclohexanone which was filtered through a 0.45µ PTFE syringe filter | 2.70 |

The above formulation was processed as in Example 50, except that an exposure of 20 seconds providing a dose of 13.6 mJ/cm$^2$ and a 30 second development time were used, to obtain a positive image.

Example 54

The following solution was prepared and magnetically stirred overnight.

| Component | Wt. (gm) |
|---|---|
| Copolymer described in Example 49, [70] IBA 100 // [30] MMA/tBMA/MAA 40/40/20, which had been solvent exchanged with PGMEA as follows. Thus, to 100.0 gm of the copolymer solution in Example 49 (59.2% Solids in MEK) was added 40.8 gm PGMEA, and rotoary evaporated under vacuum to a net weight of 99.8 gm (59.3% Solids). | 5.5 |
| Propylene glycol methyl ether acetate (PGMEA) | 15.7 |
| t-Butyl Lithocholate | 1.13 |
| 5% (wt) solution of triphenylsulfonium triflate dissolved in cyclohexanone which was filtered through a 0.45µ PTFE syringe filter | 2.70 |

The above formulation was processed as in Example 50 to give a positive image.

What is claimed is:

1. A positive-working photoresist comprising:
   (A) a branched polymer containing protected acid groups, said polymer comprising one or more branch segment(s) chemically linked along a linear backbone segment, wherein the branch segment(s) contain at least two repeating monomer units and have a number average molecular weight (Mn) of at least 1000; and
   (B) at least one photoacid general wherein the photoacid generator is covalently bonded to the branched polymer.

2. The photoresist of claim 1 wherein one of the segments contains greater than 50% of the protected acid groups present in the branched polymer.

3. The photoresist of claim 2 wherein the branch segment(s) contains greater than 50% of the protected acid groups present in the branched polymer.

4. The photoresist of claim 1 wherein the branched polymer contains functional groups that are compatible with the photoacid generator, said functional groups being distributed in the branched polymer such that 25 to 100% of the functional groups are present in the segment of the branched polymer containing a majority of the protected acid groups.

5. The photoresist of claim 1 wherein the photoacid generator is covalently bonded to the branch segment(s).

6. The photoresist of claim 5 wherein one of the segments contains greater than 50% of the protected acid groups present in the branched polymer.

7. The photoresist of claim 6 wherein the branch segment(s) contain greater than 50% of the protected acid groups present in the branched polymer.

8. The photoresist of claim 1 wherein the branched polymer is comprised of an acrylate polymer, a methacrylate polymer, an acrylate/methacrylate copolymer, and combinations thereof.

9. The photoresist of claim 1 further comprising a solvent.

10. The photoresist of claim 1 wherein the branched polymer is formed by addition polymerization of at least one ethylenically unsaturated macromer component and at least one ethylenically unsaturated comonomer.

11. The photoresist of claim 1 wherein the branched polymer segment is attached to a preformed linear backbone by chemical reaction.

12. The photoresist of claim 1 wherein
   (a) the ethylenically unsaturated macromer component has a number average molecular weight ($M_n$) in the range of 1000 to 15,000;
   (b) the linear backbone segment has a number average molecular weight ($M_n$) between about 2,000 and about 500,000; and
   (c) the weight ratio of the linear backbone segment to the branch segment(s) is within a range of about 50/1 to about 1/10.

13. The photoresist of claim 1 wherein the branched polymer has a glass transition temperature of at least 22° C.

14. The photoresist of claim 1 further comprising a dissolution inhibitor.

15. The photoresist of claim 1 wherein the branched polymer is an acrylic/methacrylic/styrenic copolymer being at least 60% by weight acrylate and having at least 60% methacrylate repeat unit content present in the copolymer in a first location, the first location being one of the segments, the second location being a segment different from the first location, wherein at least 60% of the acrylate repeat unit content in the copolymer is present in the second location.

16. The photoresist of claim 1 wherein the branched polymer is a fluorine-containing copolymer comprising a repeat unit derived from at least one ethylenically unsaturated compound containing at least one fluorine atom covalently attached to an ethylenically unsaturated carbon atoms.

17. The photoresist of claim 16 wherein the fluorine-containing copolymer is further comprised of a repeat unit derived from at least one unsaturated compound selected from the group consisting of:

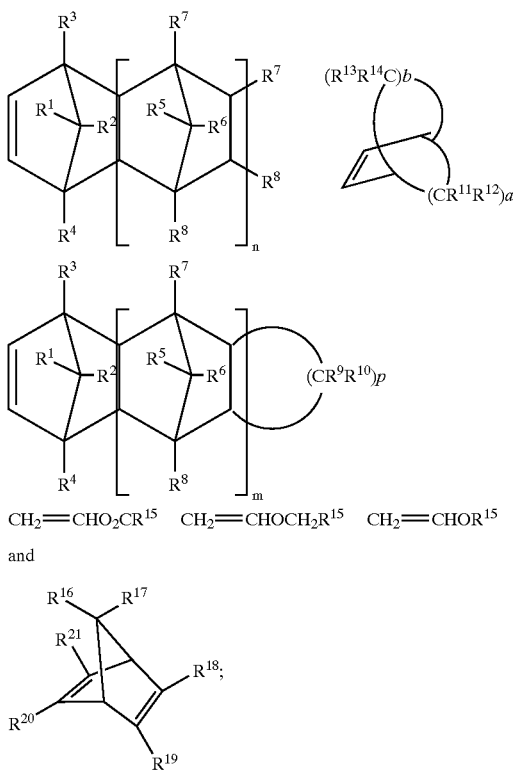

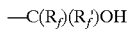

and

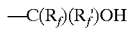

wherein:
each of m and n is 0, 1 or 2, p is an integer of at least 3;
a and b are independently 1 to 3 except that a is not=1 when b=2 or vice versa;
$R^1$ to $R^{14}$ are the same or different and each represents a hydrogen atom, a halogen atom, a carboxyl group, a $C_1$ to $C_{14}$ secondary or tertiary alkyl carboxylate, a hydrocarbon group or a substituted hydrocarbon group;
$R^{15}$ is a saturated alkyl group of about 4 to 20 carbon atoms, optionally containing one or more ether oxygens with the proviso that the ratio of carbon atoms to hydrogen atoms is greater than or equal to 0.58; and
$R^{16}$ to $R^{21}$ are each independently hydrogen atoms, $C_1$ to $C_{12}$ alkyls, $(CH_2)_qCO_2A$, $CO_2(CH_2)_qCO_2A$ or $CO_2A$ wherein q is 1 to 12 and A is hydrogen or an acid protecting group with the proviso that at least one of $R^{18}$ and $R^{21}$ is $CO_2A$.

18. The photoresist of claim 17 wherein the fluorine-containing copolymer further comprises a repeat unit derived from at least one ethylenically unsaturated compound containing a fluoroalcohol functional group having the structure:

—$C(R_f)(R_f')OH$ wherein $R_f$ and $R_f'$ are the same or different fluoroalkyl groups of from 1 to about 10 carbon atoms or taken together are $(CF_2)_n$ wherein n is 2 to 10.

19. The photoresist of claim 16 wherein the fluorine-containing copolymer further comprises a repeat unit derived from at least one ethylenically unsaturated compound containing a fluoroalcohol functional group having the structure:

—$C(R_f)(R_f')OH$ wherein $R_f$ and $R_f'$ are the same or different fluoroalkyl groups of from 1 to about 10 carbon atoms or taken together are $(CF_2)_n$ wherein n is 2 to 10.

20. The photoresist of claim 1 wherein the branched polymer is a fluorine-containing copolymer comprising a repeat unit derived from at least one ethylenically unsaturated compound containing a fluoroalcohol functional group having the structure:

—$C(R_f)(R_f')OH$ wherein $R_f$ and $R_f'$ are the same or different fluoroalkyl groups of from 1 to about 10 carbon atoms or taken together are $(CF_2)_n$ wherein n is 2 to 10.

21. The photoresist of claim 20 wherein the fluorine-containing copolymer is further comprised of a repeat unit derived from at least one unsaturated compound selected from the group consisting of:

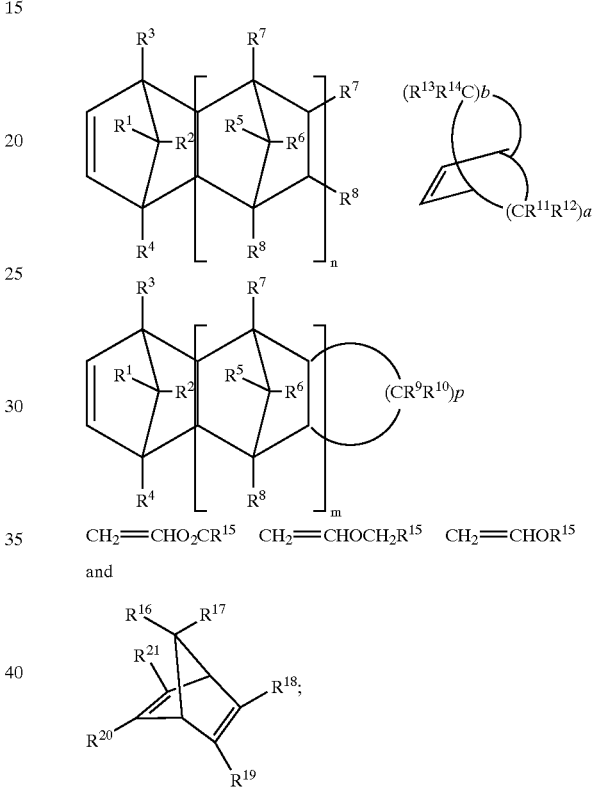

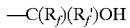

and wherein:
each of m and n is 0, 1 or 2, p is an integer of at least 3;
a and b are independently 1 to 3 except that a is not=1 when b=2 or vice versa;
$R^1$ to $R^{14}$ are the same or different and each represents a hydrogen atom, a halogen atom, a carboxyl group, a $C_1$ to $C_{14}$ secondary or tertiary alkyl carboxylate, a hydrocarbon group or a substituted hydrocarbon group;
$R^{15}$ is a saturated alkyl group of about 4 to 20 carbon atoms, optionally containing one or more ether oxygens with the proviso that the ratio of carbon atoms to hydrogen atoms is greater than or equal to 0.58; and
$R^{16}$ to $R^{21}$ are each independently hydrogen atoms, $C_1$ to $C_{12}$ alkyls, $(CH_2)_qCO_2A$, $CO_2(CH_2)_qCO_2A$ or $CO_2A$ wherein q is 1 to 12 and A is hydrogen or an acid protecting group with the proviso that at least one of $R^{18}$ to $R^{21}$ is $CO_2A$.

22. The photoresist of claim 20 wherein the photoacid generator is covalently bonded to the branch polymer.

23. The photoresist of claim 22 wherein the photoacid generator is covalently bonded to the branch segment(s).

24. The photoresist of claim 23 wherein one of the segments contains greater than 50% of the protected acid groups present in the branched polymer.

25. The photoresist of claim 24 wherein the branch segment(s) contain greater than 50% of the protected acid groups present in the branched polymer.

26. The photoresist of claim 9 wherein the solvent is selected from the group consisting of cyclohexanone, 2-butanone, propylene glycol methyl ether acetate, and methyl isobutyl ketone.

27. The photoresist of claim 9 wherein the solvent is selected from the group consisting of (i) 2-butanone and propylene glycol methyl ether acetate in combination, (ii) methyl isobutyl ketone and propylene glycol methyl ether acetate in combination, and (iii) cyclohexanone and propylene glycol methyl ether acetate in combination.

28. The photoresist of claim 1 wherein the branched polymer is an acrylic/methacrylic copolymer being at least 60% by weight acrylate and having at least 60% of methacrylate repeat unit present in a first location, the first locating being one of the segments, the second locating being a segment different from the first location, wherein at least 60% of the acrylate repeat unit content in the copolymer is present in the second location.

* * * * *

UNITED STATES PATENT AND TRADEMARK OFFICE
CERTIFICATE OF CORRECTION

PATENT NO.    : 6,884,562 B1
DATED         : April 26, 2005
INVENTOR(S)   : Fryd Michael et al.

It is certified that error appears in the above-identified patent and that said Letters Patent is hereby corrected as shown below:

Column 37,
Line 1, "Example 34" should read -- Example 33 --.

Column 49,
Line 59, "at least one photoacid general" should read -- at least one photoacid generator --.

Signed and Sealed this

Twenty-fifth Day of April, 2006

JON W. DUDAS
*Director of the United States Patent and Trademark Office*